(12) United States Patent
Stanbery

(10) Patent No.: US 7,163,608 B2
(45) Date of Patent: *Jan. 16, 2007

(54) APPARATUS FOR SYNTHESIS OF LAYERS, COATINGS OR FILMS

(75) Inventor: Billy J. Stanbery, Austin, TX (US)

(73) Assignee: HelioVolt Corporation, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/932,222

(22) Filed: Sep. 1, 2004

(65) Prior Publication Data

US 2005/0022747 A1    Feb. 3, 2005

Related U.S. Application Data

(63) Continuation of application No. 09/957,125, filed on Sep. 20, 2001, now Pat. No. 6,787,012.

(51) Int. Cl.
*C23C 14/34* (2006.01)
*C23C 16/00* (2006.01)

(52) U.S. Cl. .................. 204/298.24; 204/298.15; 204/298.23; 204/298.25; 118/715; 118/718; 118/719

(58) Field of Classification Search ........... 204/298.24, 204/298.25, 298.73, 298.23, 298.15; 118/715, 118/718, 719
See application file for complete search history.

(56) References Cited

U.S. PATENT DOCUMENTS 3,629,036 A * 12/1971 Isaacson ............... 430/256

| 4,088,544 | A | 5/1978 | Hutkin |
| 4,267,398 | A | 5/1981 | Rothwarf |
| 4,315,097 | A | 2/1982 | Solomon |
| 4,392,451 | A | 7/1983 | Mickelsen et al. |
| 4,523,051 | A | 6/1985 | Mickelsen et al. |
| RE31,968 | E | 8/1985 | Mickelsen et al. |
| 4,571,448 | A | 2/1986 | Barnett |
| 4,674,434 | A * | 6/1987 | Ishihara ............... 118/50.1 |
| 4,902,398 | A | 2/1990 | Homstad |

(Continued)

FOREIGN PATENT DOCUMENTS

DE    42 25 385 A1    2/1994

(Continued)

OTHER PUBLICATIONS

Anderson, et al, "Processing of CuInSe$_2$-Based Solar Cells: Characterization of Deposition Processes in Terms of Chemical Reaction Analyses" Final Report, May 6, 1995-Dec. 31, 1998, National Renewable Energy Laboratory, pp. 1-400, Jun. 2001.

(Continued)

*Primary Examiner*—Rodney G. McDonald
(74) *Attorney, Agent, or Firm*—John Bruckner PC

(57) ABSTRACT

Systems and methods are described for the synthesis of films, coatings or layers. An apparatus includes a first holder; a second holder coupled to the first holder; a linkage coupled to the first holder and the second holder to move the first holder relative to the second holder; a reusable tool coupled to the first holder, the reusable tool including a raised patterned surface; and a release layer coupled to the raised patterned surface of the reusable tool.

14 Claims, 8 Drawing Sheets

U.S. PATENT DOCUMENTS

| | | | |
|---|---|---|---|
| 4,902,668 | A | 2/1990 | Whitcomb et al. |
| 5,028,274 | A | 7/1991 | Basol et al. |
| 5,248,621 | A | 9/1993 | Sano |
| 5,298,449 | A | 3/1994 | Kikuchi |
| 5,396,839 | A | 3/1995 | Rice |
| 5,405,802 | A | 4/1995 | Yamagata et al. |
| 5,436,204 | A | 7/1995 | Albin et al. |
| 5,441,897 | A | 8/1995 | Noufi et al. |
| 5,477,088 | A | 12/1995 | Rockett et al. |
| 5,567,469 | A | 10/1996 | Wada et al. |
| 5,578,503 | A | 11/1996 | Karg et al. |
| 5,626,688 | A | 5/1997 | Probst et al. |
| 5,674,555 | A | 10/1997 | Birkmire et al. |
| 5,705,011 | A | 1/1998 | Bodford et al. |
| 5,756,240 | A | 5/1998 | Roberts et al. |
| 5,759,954 | A | 6/1998 | Taguchi et al. |
| 5,846,638 | A | 12/1998 | Meissner |
| 5,858,121 | A | 1/1999 | Wada et al. |
| 5,858,628 | A | 1/1999 | Yoshida et al. |
| 6,187,653 | B1 | 2/2001 | Hui et al. |
| 6,190,453 | B1 | 2/2001 | Boydston et al. |
| 6,225,190 | B1 | 5/2001 | Bruel et al. |
| 6,251,754 | B1 | 6/2001 | Ohshima et al. |
| 6,455,398 | B1 | 9/2002 | Fonstad et al. |
| 6,500,733 | B1 | 12/2002 | Stanbery |
| 6,787,012 | B1 * | 9/2004 | Stanbery ............... 204/298.24 |

FOREIGN PATENT DOCUMENTS

| | | |
|---|---|---|
| EP | 0 381 509 A1 | 8/1990 |
| EP | 0 621 130 A2 | 10/1994 |
| EP | 0 611 760 A2 | 7/1995 |
| EP | 0 661 760 A2 | 7/1995 |
| EP | 0 763 859 A2 | 3/1997 |
| EP | 0 989 593 A2 | 3/2000 |
| WO | WO 97/22152 A1 | 6/1997 |
| WO | WO 00/33363 A1 | 6/2000 |

OTHER PUBLICATIONS

Arya, et al, "Solar Cells and Submodules on CIS Prepared by EDCF Method" Solarex Corporation, Thin-Film Division, presented at the 23rd IEEE Photovoltaic Specialists Conference, pp. 1-4, May 1993.

Cahen, et al, "Room Temperature Tailoring of Electrical Properties of Ternary and Multinary Chalcogenide Semiconductors" Proc. 9th Int. Conf. Ternary and Multinary Compounds, Yokohama, pp. 1-2, Jun. 7, 1993.

Chang, et al, "Novel Multilayer Process for CuInSe$_2$ Thin Film Formation by Rapid Thermal Processing", Material Res. Society Symposium Proceedings, vol. 485, pp. 163-168, 1998.

Contreras, et al, "Progress Toward 20% Efficiency in Cu(In, Ga)Se$_2$ Polycrystalline Thin-film Solar Cells," Progress in Photovoltaics Research and Applications, Short Communication: Accelerated Publication, pp. 311-316, Mar. 26, 1999.

Eberspacher, et al, "Non-Vacuum Techniques for Fabricating Thin-Film CIGS", IEEE, pp. 517-520, 2000.

Gullen, et al, "Reaction Pathways to CuInSe$_2$ Formation from Electrodeposited Precursors" J. Electrochem. Soc. vol. 142, No. 6, pp. 1834-1838, Jun. 1995.

Hassan, et al, "Evaluation and characterization of polycrystalline CuInSe$_2$ thin films prepared by the sandwich structure technique" Semiconductor Science Technology, vol. 9, pp. 1255-1260, 1994.

Kazmerski, et al, "Thin-film CuInSe$_2$/CdS heterojunction solar cells" Applied Physics Letters, vol. 29, No. 4, pp. 268-270, Aug. 1976.

Nakada, et al, "Preparation and Characterization of CuInSe$_2$ Films for PV Applications by Low Pressure Vapor Phase Selenization," Proceedings of the 11th E.C. Photovoltaic Solar Energy Conference, pp. 794-797, Oct. 12-16, 1992.

Probst et al, "Advanced Stacked Elemental Layer Process for Cu(inGa)Se$_2$ Thin Film Photovoltaic Devices," Mat. Res. Soc. Symp. Proc., vol. 426, pp. 165-176, 1996.

Schock, "Thin film protovoltaics," Applied Surface Science, vol. 92, pp. 606-616, 1996.

Teheran, et al, "Evolution of the phases and chemical composition during the formation of CIS thin films prepared by interdiffusion process in selenides layers" Journal of Crystal Growth, vol. 183, pp. 352-360, 1998.

W. Y. Lee, F. Sequeda, S. J., and D. Chapman, "Field-assisted bonding below 200° C using metal and glass thin-film interlayers," Applied Physics Letters, vol. 50, pp. 522-524, 1987.

Stanbery, et al. XPS Studies of sodium compound formation and surface segregation in CIGS thin films: Conference record of the 26th IEEE Photovoltaic Specialists Conf., Oct.3, 1997, pp. 499-502.

Braunger, et al. "Influence of sodium on the growth of polycrystalline Cu(in,Ga)Se2 thin films" Thin Solid Films, Elsevier-Sequoia S. A. Lausanne, Ch. vol. 361-362, Nr. 1, pp. 161-166.

Stanbery, et al. "Role of sodium in the control of defect structures in CIS solar cells" Conference record of the 26th IEEE Photovoltaic Specialists Conf., Sep. 15-22, 2000, pp. 440-445.

Lammasniemi, et al. "Characteristics of Indium Phosphide Solar Cells Bonded in Silicon" Proceedings of the Photovoltaic Specialists Conference, May 10-14, 1993, New York, IEEE, vol. Conf. 23, pp. 763-767.

Nowlan, et al. "Direct Dover Glass Bonding to GaAs and GaAs/Ge Solar cells" Proceedings of the Photovoltaic Specialists Conference, Law Vegas, Oct. 7-11, 1991, pp. 1480-1484.

International Search Reported for PCT/US02/29684 mailed Sep. 18, 2003.

Brian M. Keyes et al., "Influence of Na on the Electro-Optical Properties of Cu(In,Ga)Se$_2$," 26th PVSC; Sep. 30-Oct. 3, 1997; Anaheim, CA, pp. 479-482.

B.J. Stanbery et al., "Role of Sodium in the Control of Defect Structures in CIS," 0-7803-5772-8/00 2000 IEEE, pp. 440-445.

* cited by examiner

US 7,163,608 B2

APPARATUS FOR SYNTHESIS OF LAYERS, COATINGS OR FILMS

CROSS-REFERENCE TO RELATED APPLICATION

This application is a continuation of, and claims a benefit of priority under 35 USC 120 from utility patent application U.S. Ser. No. 09/957,125, filed Sep. 20, 2001, now U.S. Pat. No. 6,787,012, the entire contents of which are hereby expressly incorporated herein by reference for all purposes.

BACKGROUND OF THE INVENTION

1. Field of the Invention

The invention relates generally to the field of materials. More particularly, the invention relates to equipment for the synthesis of layers, coatings or films. Specifically, a preferred implementation of the invention relates to equipment for the synthesis of layers, coatings or films the utilizes pressure, heat, precursor layer exerted pressure containment, an electrostatic field, a template and/or a surfactant.

2. Discussion of the Related Art

A plethora of methods have been used for the synthesis of films (coatings) composed of materials from the CIS (copper indium selenide) material system and related alloys, but each of the previous methods has characteristics that limit their applicability to the economical manufacture of films with properties suitable for application to optoelectronic devices, such as photovoltaic (PV) devices. PV devices require an optical absorber that also provides sufficiently long minority carrier lifetimes to enable the collection of the minority carriers by the electrodes in the device's structure without excessive recombination. In all semiconductor materials minority carrier lifetimes are dependent on the defect structure of those materials. The control of defect structure is critical to the successful manufacture of PV devices. Similarly the defect structure of high-temperature superconductors, electroluminescent phosphors, and other (opto-)electronic materials control the physical properties that determine their efficacy for their respective intended uses.

Thin film optical absorbers are more economical than thick film absorbers or coatings because they require a smaller amount of the precursor materials than thick films or coatings. The formation of thin films with desirable defect properties is predominately determined by the method by which they are synthesized. Early efforts to fabricate thin film CIS PV devices that relied on the steady-state co-deposition of the constituent elements copper, indium, and selenide were not very successful[1]. The first efficient thin film CIS PV devices were achieved by a two-step process that relied on the sequential deposition of two layers onto a substrate at high temperature, each with different composition. These layers reacted and intermixed to yield a nominally uniform composition throughout their combined thickness, and resulted in films with desirable defect structures[2-4]. Variations of this method have been demonstrated, based on different temperatures, numbers of layers, and compositions thereof.[5,6] Other fundamentally different approaches have been described that rely on, for example: (1) heating stacked layers of the metals (e.g., copper, indium and gallium) and selenide that have been sequentially deposited at low temperatures[7-9], (2) thermal reaction of metallic layer precursors in hydrogen selenide[10,11] or selenide vapor[12], (3) thermal reaction of oxide particulate precursor mixture layers at high temperatures[13], and (4) thermal reaction of binary (Cu,Se) and (In,Se) precursor layers[14,15].

An economical process for the manufacture of thin films of these sorts of non-stoichiometric multinary compounds needs to both efficiently use raw materials and be rapid (for low cost), but must be flexible to enable control of the defect structures required for high performance. None of the methods in the prior art provide an optimal combination of these features. Heretofore, the requirements of efficient raw material utilization, rapid fabrication, and flexibility for optimization of defect properties referred to above have not been fully met. What is needed is a solution that simultaneously addresses all of these requirements.

SUMMARY OF THE INVENTION

There is a need for the following embodiments. Of course, the invention is not limited to these embodiments.

According to an aspect of the invention, a method comprises: exerting a pressure between a first precursor layer that is coupled to a first substrate and a second precursor layer that is coupled to a second substrate; forming a composition layer; and moving the first substrate relative to the second substrate, wherein the composition layer remains coupled to the second substrate. According to another aspect of the invention, a method comprises: applying an electrostatic field across a first precursor layer that is coupled to a first substrate and a second precursor layer that is coupled to a second substrate; forming a composition layer; and moving the first substrate relative to the second substrate, wherein the composition layer remains coupled to the second substrate. According to another aspect of the invention, a method comprises: locating a template within at least one of a first precursor layer that is coupled to a first substrate and a second precursor layer that is coupled to a second substrate; forming a composition layer; and moving the first substrate relative to the second substrate, wherein the composition layer remains coupled to the second substrate. According to another aspect of the invention, a method comprises: providing a surfactant as an impurity within at least one of a first precursor layer that is coupled to a first substrate and a second precursor layer that is coupled to a second substrate; forming a composition layer; and moving the first substrate relative to the second substrate, wherein the composition layer remains coupled to the second substrate. According to another aspect of the invention, an apparatus comprises: a first holder; a second holder coupled to the first holder; a linkage coupled to the first holder and the second holder to move the first holder relative to the second holder; a reusable tool coupled to the first holder, the reusable tool including a raised patterned surface; and a release layer coupled to the raised patterned surface of the reusable tool. According to another aspect of the invention, a composition comprises: a composition layer defining a first surface and a second surface, the composition layer including a collection layer that is located closer to the first surface than to the second surface.

These, and other, embodiments of the invention will be better appreciated and understood when considered in conjunction with the following description and the accompanying drawings. It should be understood, however, that the following description, while indicating various embodiments of the invention and numerous specific details thereof, is given by way of illustration and not of limitation. Many substitutions, modifications, additions and/or rearrangements may be made within the scope of the invention without departing from the spirit thereof, and the invention includes all such substitutions, modifications, additions and/or rearrangements.

BRIEF DESCRIPTION OF THE DRAWINGS

The drawings accompanying and forming part of this specification are included to depict certain aspects of the invention. A clearer conception of the invention, and of the components and operation of systems implemented the invention, will become more readily apparent by referring to the exemplary, and therefore nonlimiting, embodiments illustrated in the drawings, wherein like reference numerals designate the same elements. The invention may be better understood by reference to one or more of these drawings in combination with the description presented herein. It should be noted that the features illustrated in the drawings are not necessarily drawn to scale.

DESCRIPTION OF PREFERRED EMBODIMENTS

Figure 1A:
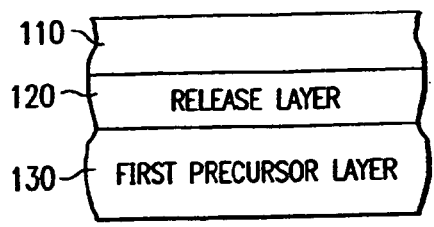
FIGS. 1A–1D illustrate schematic side views of a subgeneric process to produce a composition layer on a substrate, representing an embodiment of the invention.
Figure 1A:
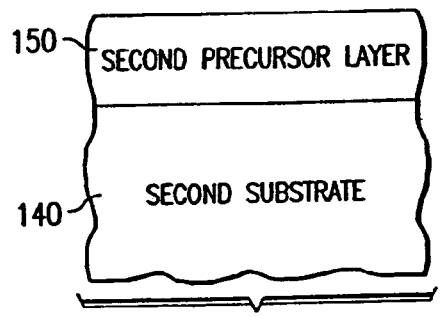

The invention and the various features and advantageous details thereof are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Within this application several publications are referenced by superscript Arabic numerals. Full citations for these, and other, publications may be found at the end of the specification immediately preceding the claims. The disclosures of all these publications in their entireties are hereby expressly incorporated by reference herein for the purpose of indicating the background of the invention and illustrating the state of the art.

The specification of this application is similar to U.S. Ser. No. 09/957,132, filed Sep. 20, 2001 now U.S. Pat. No. 6,500.733; U.S. Ser. No. 09/957,207, filed Sep. 20, 2001 now U.S. Pat. No. 6,593,213; U.S. Ser. No. 09/957,050, filed Sep. 20, 2001 now U.S. Pat. No. 6,736,986; U.S. Ser. No. 09/957,123, filed Sep. 20, 2001 ; and U.S. Ser. No. 09/957,121, filed Sep. 20, 2001 now U.S. Pat. No. 6,559,372, the entire contents of all of which are hereby expressly incorporated by reference herein for all purposes.

The below-referenced U.S. patents disclose embodiments that were satisfactory for the purposes for which they are intended. The entire contents of U.S. Pat. No. 4,392,451 to Mickelsen, et al., issued Jul. 12, 1983; U.S. Pat. No. 4,523,051 to Mickelsen, et al., issued Jun. 11, 1985; Re. 31,968 to Mickelsen, et al., reissued Aug. 13, 1985; U.S. Pat. No. 5,396,839 to Tuttle, et al., issued Oct. 18, 1994; U.S. Pat. No. 5,436,204 to Albin, et al., issued Jul. 25, 1995; U.S. Pat. No. 5,441,897 to Noufi, et al., issued Aug. 15, 1995; U.S. Pat. No. 5,567,469 to Wada, et al., issued Oct. 22, 1996; U.S. Pat. No. 5,578,503 to Karg, et al., issued Nov. 26, 1996; and U.S. Pat. No. 5,674,555 to Birkmire, et al., issued Oct. 7, 1997 are hereby expressly incorporated by reference herein for all purposes.

In general, the context of the invention can include the fabrication of a composition layer, coating or film that may be used in a subassembly, which may in-turn be used in a larger assembly. The context of the invention can include the fabrication of a semiconductor layer, coating or film for use in, for example, a photovoltaic device and/or system. The context of the invention can also include the fabrication of a superconductor layer, coating or film for use in, for example, an electronic or electrical device and/or system.

The invention solves the problems in the prior art approaches discussed above by providing precursor layers on different surfaces which are then placed into contact with one another. The precursor layers can then be interacted chemically and/or physically to produce the composition layer. The surfaces can be defined by one or more substrates and/or one or more tools. The substrate(s) and/or tool(s) can each define one, or more than one, surface onto which the precursor substance is deposited. The substrate(s) and/or tool(s) can be compliant, thereby improving contact between the precursor layers, improving pressure control, structure transfer and/or surface behavior during interaction of the precursor layers.

Preferred embodiments of the invention deposit two different precursor layers onto two different substrates, or on a substrate and a tool, or even on two different tools. The deposited precursor layers are then contacted together. The contacted precursor layers can then subsequently interact under the influence of motion, heat, pressure, electrostatic fields, (quasi)epitaxial forces, surfactants, magnetic fields and/or catalysts. At least a part of one of the substrates can then be modified. The composition layer can remain coupled to the other substrate. Modifying can include removing, by etching and/or mechanical motion. It may be desirable not to modify a portion of the first substrate, for example not remove that portion so that it remains on the composition layer. The surfaces can then be moved relative to one another resulting in release of the unified layer(s) from one of the original surfaces and/or adhesion of the unified layer(s) to only one of the original surfaces.

FIGS. 1A–1D show a sequence of process steps. In FIG. 1A, a first substrate 110 is coupled to a release layer 120. The release layer 120 is coupled to a first precursor layer 130.

Figure 1B:
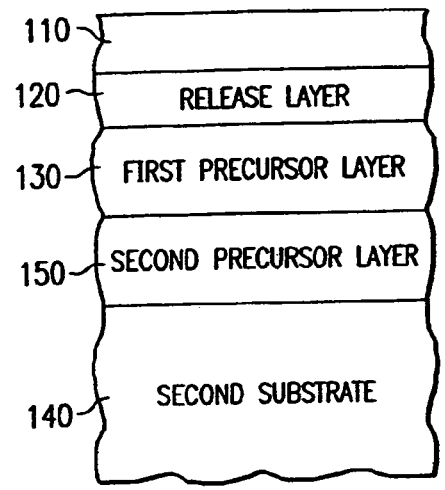
Figure 1C:
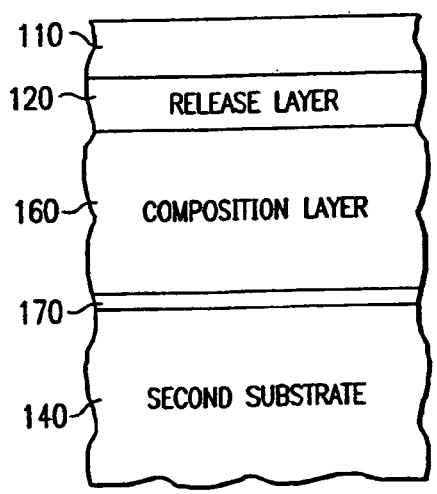
Figure 1D:
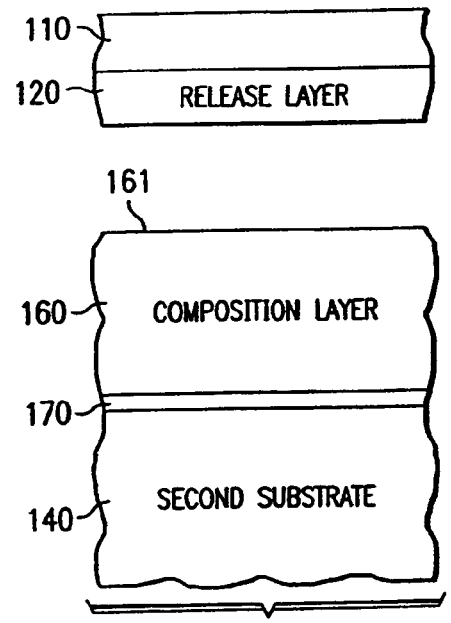

A second substrate 140 is coupled to a second precursor layer 150. In FIG. 1B, the first precursor layer 130 and the second precursor layer 150 have been brought into contact so they can interact directly. The contact is preferably intimate to establish and maintain a planar interaction front. In FIG. 1C, a composition layer 160 has resulted from the interaction. In FIG. 1D, the first substrate 110 and the release layer 120 have been moved away from the composition layer 160 which remains on the second substrate 140.

The invention can include the formation of a collection layer 170, preferably located between the composition layer 160 and the second substrate 140. The location of the collection layer 170 away from a free surface 161 of the composition layer 160 can be an important aspect of the invention. The function of the collection layer 170 can be to sequester undesirable material, preferably in a safe location. The collection layer 170 (which can also be termed a collection zone) can be positioned away from sensitive device locations such as semiconductor regions. The collection layer can include undesirable material such as excess precursor(s), secondary phase precipitates, impurities, residue and/or debris. The collection layer 170 can provides a physical signature or fingerprint that can be detected and/or characterized within assemblies (devices) that incorporate the composition layer 160. The collection layer 170 can make a determination of whether an electronic (e.g., photovoltaic) device infringes the claimed invention relatively easy.

The interaction between the precursors layers can be chemical (e.g., reactants forming a product) and/or physical (e.g., two polymers intermingling to form a copolymer or two metals diffusing together to form a solid solution). The invention is more flexible than the prior art approaches described previously because it allows separate optimization of the composition, structure, and deposition processes for the precursor (e.g., reactant) layers apart from the optimization of the chemical and/or physical reaction used to form the composition layer (e.g., a chemical product layer in the form of a final film).

It is desirable that the compositions of the two precursor layers be such that a difference of melting point temperature exists between them so that one of them may be heated to its melting point temperature without melting the other. This enables a thin-film liquid-solid reaction process, which can be controlled by the application of motion, heat, pressure, electrical bias, templates, and/or surfactants between the compliant substrate and reusable tool to yield layers, coating and/or films with the desired composition (and gradients thereof), structure and defect distributions.

These precursor structures (e.g., layers) are different from those previously described in the art because they are designed in pairs, one for deposition onto each of the two surfaces (e.g., tool surface and substrate surfaces). The substrate upon which the unified composition layer is formed by the interaction of the pair of precursors can remain as part of an assembly containing the composition layer.

The other substrate can be a reusable tool composed of, for example, silicon. The working surface of the reusable tool can be coated with a release layer composed of, for example, calcium fluoride, strontium fluoride and/or their alloy $(Ca,Sr)F_2$. Such a reusable tool can be used to apply pressure, as a counter-electrode for electrical biasing, and/or as a crystallographic template to control the structure of the precursor structure grown thereupon, can be recharged with subsequent precursor structures, optionally on a continuous basis.

The invention can include the fabrication of the precursor layer(s) on the substrate(s). For instance, the precursor layers can be fabricated by sputtering followed by plasma discharge, particle deposition, physical vapor deposition and/or chemical vapor deposition. In a preferred embodiment, one or both of the precursor layers can be fabricated by sputtering of an elemental metal (e.g., copper) followed by plasma discharge of another element (e.g., elemental selenide vapor).

The invention can include subsequent processing of the composition layer. For instance, the composition layer can be post-process heated in an atmosphere (e.g., air or oxygen) to tailor the defect structure and/or improve performance. This post-processing heating in an atmosphere can be termed annealing.

The invention can include devices that incorporate the resulting composition layer(s) (e.g., PV devices that contained the composition layer as an absorber layer(s)). Further, the invention can also include systems that include such devices. The invention can include equipment for forming the composition layer(s).

The following example uses the copper-indium-selenide (CIS) material system and material systems formed by the addition of gallium (CIGS), sulfur (CISS), or aluminum (ACIS), and/or combinations thereof (e.g., CIGSS, ACIGSS, etc.). The use of these material systems is merely exemplary of the methods described herein and is not intended to suggest that the invention is limited to these material systems. The general properties of these materials that render the invention applicable will be described in enabling detail.

Figure 2A:
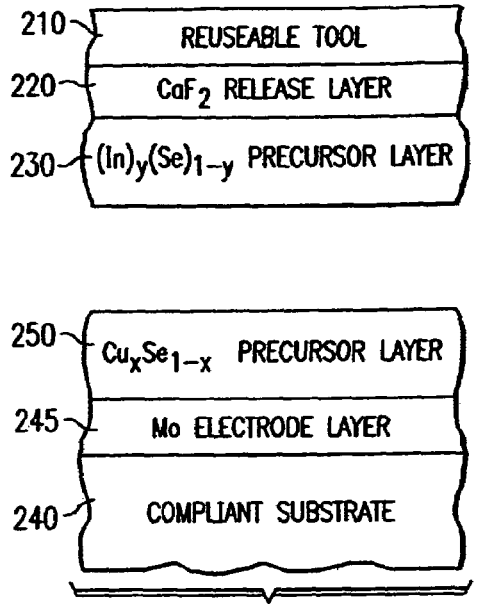
FIGS. 2A–2D illustrate schematic side views of a process to produce a CIS absorber layer on an electrode coated substrate, representing an embodiment of the invention.
Figure 2B:
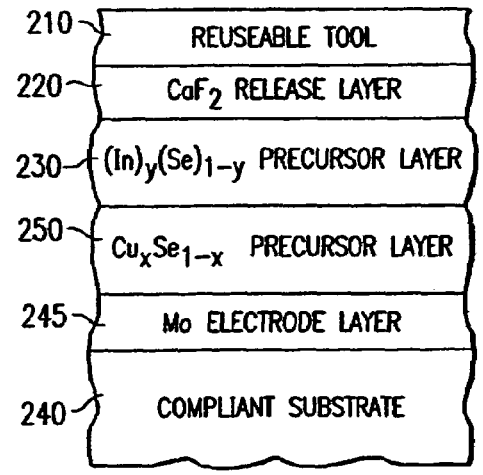
Figure 2C:
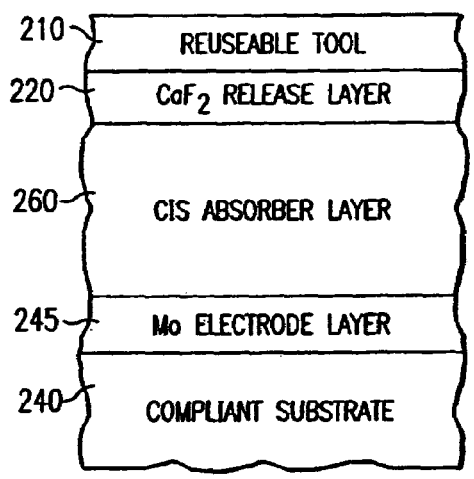
Figure 2D:
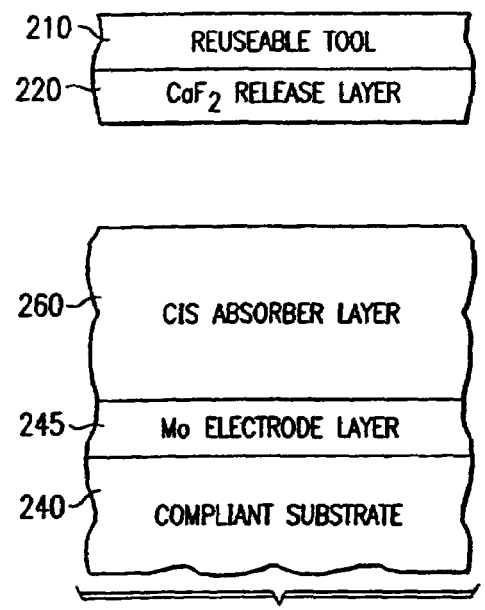

FIGS. 2A–2D depict a process sequence used to make a CIS material layer. In FIG. 2A, a reusable tool 210 is coupled to a calcium fluoride release layer 220. The calcium fluoride release layer 220 is coupled to an indium selenide precursor layer 230. A compliant substrate 240 is coupled to a molybdenum electrode 245. The molybdenum electrode 245 is coupled to a copper selenide precursor layer 250. In FIG. 2B, the indium selenide precursor layer 230 and the copper selenide precursor layer 250 have been brought into intimate contact. In FIG. 2C, a chemical reaction product layer 260 (CIS) has resulted from the interaction. In FIG. 2D, the reusable tool 210 and the calcium fluoride release layer 220 have been moved away from the chemical reaction product layer 260 which remains on the compliant substrate 240.

In this example, CIS films are formed by the deposition of binary copper monoselenide onto a molybdenum-coated substrate and indium sesquiselenide onto a calcium fluoride-coated silicon substrate. Since the substrates are separate, the deposition of these precursor layers can be done at different temperatures. When these composites are brought together under mechanical pressure and rapidly heated to an appropriate temperature of above approximately 520° C. but below approximately 635° C., only the copper monoselenide layer will melt.

Sufficient mechanical pressure can substantially prevent the loss of selenide vapor from the reaction zone, thereby achieving highly efficient incorporation of selenide into the composition layer (in this example, a chemical product layer). In this example, the pressure should be from approximately 0.01 atm to approximately 10.0 atm, preferably from approximately 0.2 atm to approximately 1.0 atm if sulphur is substantially not present. Other examples that do not use copper selenide may not need as much pressure.

In this example, the adhesion of the resulting CIS film to the molybdenum will be substantially stronger than its adhesion to the calcium fluoride release layer and the resulting CIS film will only adhere to the molybdenum-coated substrate, permitting reuse of the calcium fluoride-coated silicon substrate as a reusable tool. In this example, the final thickness of the CIS film can be from approximately 0.5 microns to approximately 3.5 microns, preferably from approximately 1.0 microns to approximately 3.0 microns.

The invention can include the use of an electrostatic field applied across the first precursor layer and the second precursor layer.

The application of a voltage between the molybdenum film (or underlying substrate carrier) and the silicon wafer (which bears the calcium fluoride coating), with the electrostatic potential of the silicon wafer higher than that of the molybdenum film, will tend to retard the transport of positive copper ions into and through both the indium sesquiselenide layer and the resulting adjacent indium-rich CIS layer that is formed during the reaction. The calcium fluoride release coating is an insulator, thereby preventing current flow between the precursor layers and establishing the electrostatic field.

This will assist in maintaining a planar reaction front. This will also assist in minimizing composition fluctuations by providing a negative feedback mechanism to inhibit the formation of dendritic structures during the reaction. The electric field applied can be from approximately 0.03 volts/micron to approximately 3.5 volts/micron, preferably from approximately 0.3 volts/micron to approximately 1.0 volts/micron. It can be appreciated that the electric field can generate a significant force between the first precursor and the second precursor, thereby adding to pressure that is otherwise exerted mechanically. Further, the overall pressure can be controlled (e.g., modulated) without mechanical manipulation by changing the applied electric field.

The electrical bias during the synthesis process can be applied in a large number of ways and the optimal technique will depend on the details of the materials used for the various parts. If the release layer is an electrically insulating material and the reusable tool conductive, the bias is preferably applied between the electrode layer and the tool. The closer that the biased surfaces are brought together the higher the electric field strength across the precursor layers during the synthesis process for any given potential difference between those electrodes. In any case it is desirable that there is at least one non-conducting layer separating the biased electrodes so that electrical current does not flow between them when their precursor layers are brought into contact with one another.

The use of an electrical bias between the upper and lower substrates during heating and precursor interaction can have a number of beneficial effects. First, a static potential difference will always create an attractive force between the precursors that will serve to insure their intimate contact during heating. A static potential difference can be used to control the pressure in the reaction zone itself, an elementary consequence of electrostatic field theory.

The tendency of the electric field to planarize the reaction front between the binary precursors used in the preferred embodiment for CIS synthesis is a more subtle consequence of the fact that their reaction product, CIS, is substantially less electrically conductive than either of the precursors themselves. As a consequence, any perturbation that creates curvature at the interface between a relatively conductive binary precursor and CIS locally increases the electric field intensity. If the direction of that field inhibits diffusion of the ionic reactants, the reaction front will be slowed in proportion to the local curvature. This self-moderation effect (negative feedback) tends to planarize the reaction front, and its relevance to the synthesis of a composition layer by this method is contingent only on (1) the composition (e.g., product) being substantially less conductive than the precursors (e.g., reactants), and (2) the existence of at least one ionic specie that must transport out of a precursor layer, in this example to react and lead to formation of the product material. Note that in the context of condensed state material physics the phrase ionic specie, as used herein, is defined as an entity which feels a force in the presence of an electric field. Of course, the polarity of the electrostatic field can be reversed. As an initial configuration parameter, during the interaction and/or modulated during the interaction.

There can be explosive kinetics involved. The electrostatic field can be used to control the reaction trajectory. It may be desirable to reverse the field in different parts of the process. It is possible to use the reverse bias to slow down the diffusion of copper. It is also possible to reverse an initial electrostatic field over part of the reaction cycle, to force copper out at a faster rate, thereby changing the kinetics by changing the relative attachment rate to the crystallographic front, of copper and selenide. This can be termed forward bias. The invention can include incorporating selenide into the lattice from the melt. But the selenide does not have a crystallographic guiding force or a chemical guiding force to attach to that surface, unless one is also transporting copper into it. If the selenide is allowed to attach faster than the copper, a phase transition would then occur that could cause solidification within that liquid layer. Faster selenide attachment involves a shift over to the side of the binary phase diagram where the dominant stable specie is di-copper selenide, $Cu_2Se$. In contrast, with slower selenide attachment the dominant stable specie is closer to CuSe. By reverse biasing, the diffusion of copper into the indium-selenide layer can be inhibited. A build up of copper in that layer occurs faster than rolling up the selenide. It is undesirable to move toward the $Cu_2Se$ side of the phase diagram and precipitate solid $Cu_2Se$ crystals. The field can be used to control the relative transport rate. In this example, the interaction is a transport-related reaction. The desired crystalline properties are propagated up toward the tool layer by, among other things, solid state diffusion of copper. The solid state transports but it is not necessarily diffusive transporting. Diffusive transport is governed by the diffusion equation so that it always ends up with a straight line profile for composition. However, non-diffusive transport is possible. An example is convection. Convection is characterized by a first order differential equation rather than a second. With a field-assisted transport, an intermediate case is acquired, which depends on the field strength. That intermediate case, depending on the direction of the field, can either inhibit the copper transport or, accelerate it. The injection of copper into that surface will lead to a restructuring process. Therefore, a higher copper content at the front can be desirable. If the front copper content is high enough, it will have already caused a transformation from hexagonal to FCC stacking. That is the desirable crystallographic front to which the copper transporting through the indium selenide should attach. An alternating field as well as a static field, or combinations thereof may be used to create the electric bias. By modulating a reversal of the field, the reaction trajectory can be controlled, optionally in a time domain manner.

The invention can include the use of a structure transfer layer or substance. These structure transfer layer(s) and/or substance(s) can be termed a template. The template can be used to transfer the morphology of one layer to another. The template can be used to transfer meta-symmetry from one layer to another. The template can be used to epitaxially transfer a lattice structure from one layer to another.

As an example of a template layer, the invention can include putting a relatively group 1 rich template film (e.g., copper indium selenide) on the release layer. The upper end of such a relatively group 1 rich layer can be approximately 25% group 1 by mole. The additional copper or other group 1 element tends to attach or incorporate more copper during the precursor interaction. The crystallographic structure of a pure indium selenide film varies with the ratio of indium to selenide in the film. But it is always irrespective of that ratio characterized by a hexagonal stacking of the selenide sublattices. A potential problem is that the composition layer desired in the end may have a different stacking structure. Aluminum and copper can be alloyed can be alloyed on the Group 1 sublattice sites in this structure. Gallium and germanium can be alloyed among the Group 3 lattice sites. Sulfur and selenide can be alloyed on the Group 6 sites. The prototypical compound for these examples is copper indium diselenide. And all of these compounds, if they have sufficient copper, will be characterized by face centered cubic stacking of the selenide sublattice rather than hexagonal. The idea of alloying Group 1 elements into the front surface (between the release layer and the precursor bulk) is to create a part of that layer which will be transferred that is already characterized by the desired FCC structure for the group 6 sublattice, which is the one that sulfur and selenide lie on. If one creates a very highly ordered layer, even though that layer may be very thin, it will act as a template for the regrowth and the restructuring of the underlying precursor layer onto the template (from the hexagonal stacking into the FCC stacking).

A very highly ordered region at that top surface is desirable since that top surface becomes the junction. A structure like this may be used to implement bandgap-composition engineering, that is controlling the forbidden gap in the graded-composition layers. Thus, it can be desirable to put in elements that substantially do not redistribute during the reaction process. An example of a relatively static group 1 element is aluminum. Aluminum is far less mobile than copper. By adding aluminum to the surface region in contact with the reusable tool, it will stay there, and it will have the effect of increasing the width of the band gap in that region, which can be used to tailor the electronic properties of the junction region itself. Further, it can be desirable to add sulfur to this region to tailor the properties of the junction.

By controlling the ratio of the different elements, the position of the electrochemical potential can be controlled. The electrochemical potential at absolute zero is equivalent to and referred to by physicists in general as the Fermi level.

By constraining the surface of the group 1 rich layer against the release layer of the reusable tool, it can take on the surface morphology of the tool, which can be used to create a very smooth junction, which is desirable from an electronic point of view because the voltage of the device is proportional to the logarithm of the ratio of the light-generated current to the recombination current. The recombination current at the junction is directly proportional to the junction's surface area. It is, therefore, desirable to minimize the actual contact area to allow the voltage to go up. To keep the actual contact area minimized you should keep the junction interface flat.

The invention can include the use of a process facilitator such as a surfactant. The surfactant can be an alkali (e.g., sodium). The surfactant can be incorporated into one or both precursors as an impurity. The maximum local content of surfactant should not exceed the threshold for precipitation of secondary phases (e.g., approximately 0.5% by weight of sodium in the case of CIS and related materials). The surfactant lowers surface tension. The surfactant can improve diffusion rates, improve the crystallographic structure, defect properties and/or planarity.

The sodium may prevent the formation of local defects which can lead to an undesirable crystallographic structure. The sodium tends to aggregate at the interface of the high copper region and the high indium region. It can be desirable to alloy the sodium during the deposition of the indium selenide layer to have a substantial sodium content near the release layer. If a high copper layer is located between the release layer and an adjoining sodium impurity containing sublayer of the indium selenide, the sodium impurity containing sublayer will ride on the interface between the high indium and the high copper, and retard the incorporation of copper except at that interface. This can involve forming a junction crystallographic region first, and then incorporating sodium behind that region. Aluminum can be included in the region adjoining the release layer. The aluminum will be less mobile than the copper. Sulfur can also be included in the region adjoining the release layer. Sulfur improves the defect properties at the junction. When sodium is incorporated at a concentration low enough to prevent precipitation of sodium selenides, it will ride on that interface and collect there. The copper being transported through will not crystallize out; the copper will not initiate precipitation of another nucleus, until the copper hits that interface where the copper is already high, and it will displace the sodium, floating the sodium towards the melt surface. Thus, the invention can include a release layer, then an aluminum-copper-indium-gallium sulfo-solenide layer and then a sodium containing layer, followed by the bulk of the first precursor layer.

The sodium should be introduced as an impurity rather than a separate layer. The sodium should be delivered to one or both of the precursor layers in a dilute form during the growth of the precursor layer(s). The reason the sodium can move (can ride on the interface) may be that the sodium has lower solubility in the ternary compound (e.g., CIGS, which is an alloy of two ternary compounds) than in the binary compound. If the sodium is too concentrated, an undesirable a secondary phase may precipitate. The surfactant may work better if it is not that concentrated.

The invention can include incorporating the sodium as an impurity throughout all of the first precursor layer and/or all of the second precursor layer. This can be desirable since some of the sodium may be left behind in the crystallizing material layer as the primary surfactant containing layer advances (floats) away from the release layer. Doping the sodium as an impurity throughout the first precursor layer and/or the second precursor layer can be used to replace that sodium which may be left behind. However, if the doping concentration of the sodium throughout the first precursor layer and/or the second precursor layer is too high, the advancing primary surfactant containing layer may become too rich in sodium. If the sodium impurity concentration layer becomes too high, undesirable secondary sodium containing phases may precipitate within the crystallizing composition layer. Further, the concentration of the sodium impurity within the primary sodium containing layer can change as a function of the float velocity. A high float velocity will tend to compress the primary sodium containing layer. Again, if the sodium concentration is too high, undesirable secondary sodium containing phases may precipitate. Therefore, it may be desirable to control the float velocity to prevent excessive sodium build-up or, alternatively, increase the sodium concentration if it is too low.

All of the techniques described in the preceding example of a preferred embodiment of an approach for CIS synthesis do not need to be used together in order to provide a superior alternative to existing approaches. For example, the precursors described above could both be deposited onto the molybdenum surface and the calcium fluoride-coated silicon substrate coated with a very thin film of CIS, CIGS, CIGSS, or ACIGSS before the assembly is brought together under pressure. In either case, the use of calcium fluoride as an interlayer between the precursors and the silicon serves the multiple functions of a release layer, a diffusion barrier to the thin film's elemental components, a dielectric barrier preventing electrical current flow from the silicon surface through the film during synthesis if a voltage bias is used, and a crystallographic template for the epitaxial growth of the film.

It should also be noted that the relative position of the precursor layers described in the foregoing example is not essential. The copper selenium containing precursor layer could be initially deposited on the release layer coated tool. The indium selenium containing precursor layer could be initially deposited on the electrocoated substrate. The auxiliary layers (the group 1 rich layer and the surfactant containing layer) might then also need to be repositioned.

The use of just temperature and mechanical pressure to control the reaction trajectory of the film formation process would still be superior to processes using only a single substrate because the invention can prevent the loss of selenide during the reaction. Selenide vapor is not efficiently incorporated into films grown by conventional co-deposition methods, leading to additional equipment and raw materials cost to avoid its deficiency in the product when such approaches are used, since inadequate selenide incorporation is known to yield CIS with poor electronic properties for PV device applications. This avoidance of the need for additional equipment and/or raw materials can be a very significant advantage of the invention.

Another example of a partial implementation of the preceding example of a preferred CIS embodiment would be to use that same method but without the pressure exerted by the precursors. The temperature, the electrostatic field, the template(s), the surfactants, the magnetic field and/or catalyst(s) would still be sufficient to drive the interaction between the precursors, albeit with the possible loss of vapor from the precursors and/or material layer, depending on the composition of these layers.

Another example of a partial implementation of the preceding example of a preferred CIS embodiment would be to use that same method but without an electrical bias between the substrate and the tool. The pressure exerted between the precursors, the templates, the surfactant(s), the magnetic field and/or catalyst(s) would still be sufficient to drive the interaction between the precursors.

Another example of a partial implementation of the preceding example of a preferred CIS embodiment would be to omit the template. The pressure exerted between the precursors, the electrostatic field, the surfactant(s), the magnetic field and/or catalyst(s) would still be sufficient to drive the interaction between the precursors. Many of the benefits described here will still accrue in the situation where no appropriate epitaxial dielectric is available. For example, a non-epitaxial dielectric layer of aluminum oxide would still act as an effective atomic diffusion and current barrier, but without the benefits of transferring a desirable crystallographic orientation and grain structure from the tool into the growing film.

Another example of a partial implementation of the preceding example of a preferred CIS embodiment would be to omit the process facilitator (e.g., surfactant). The pressure exerted between the precursors, the electrostatic field, the templates, the magnetic field and/or catalyst(s) would still be sufficient to drive the interaction between the precursors.

Figure 3A:
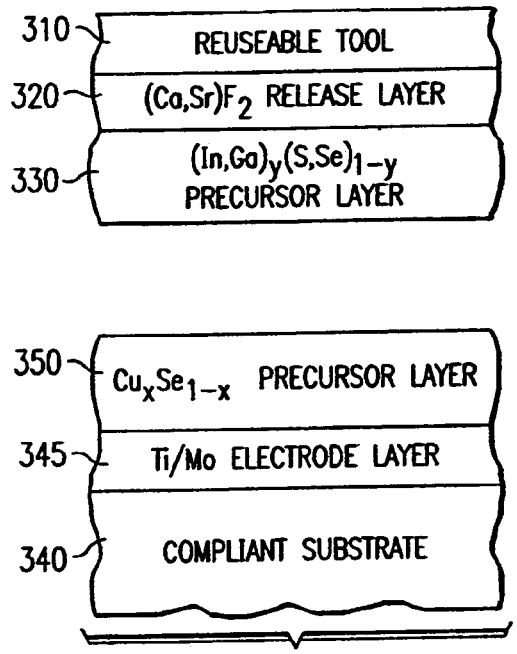
FIGS. 3A–3D illustrate schematic side views of a pressure containment utilizing process to produce a CIGSS layer on an electrode coated substrate, representing an embodiment of the invention.
Figure 3B:
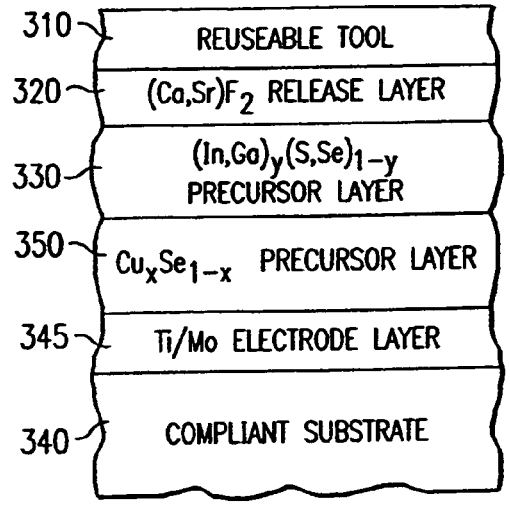
Figure 3C:
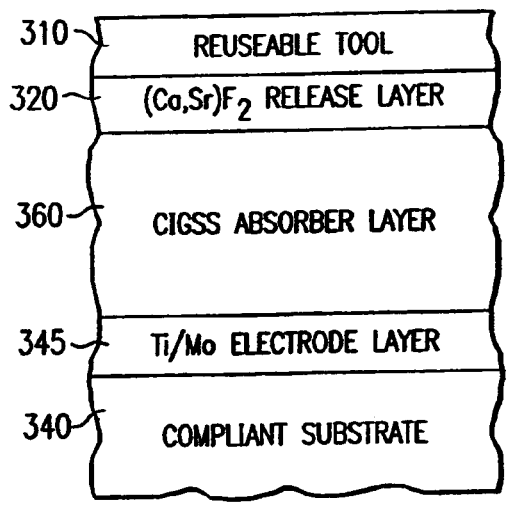
Figure 3D:
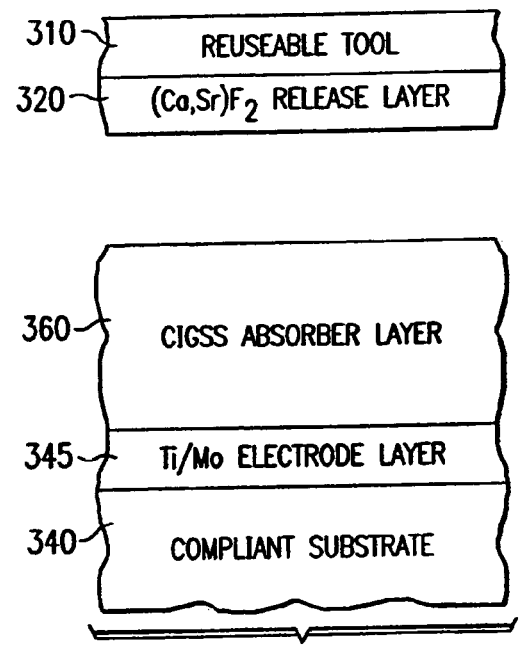

FIGS. 3A–3D shows an example of the synthesis of CIGSS absorber films for PV device applications. In FIG. 3A, a reusable tool 310 is coupled to a $(Ca,Sr)F_2$ release layer 320. The $(Ca,Sr)F_2$ release layer 320 is coupled to an $(In,Ga)_y(S,Se)_{1-y}$ precursor layer 330. A compliant glass substrate 340 is coupled to a titanium/molybdenum electrode 345. The electrode 345 is coupled to a copper selenide precursor layer 350. In FIG. 3B, the $(In,Ga)_y(S,Se)_{1-y}$ precursor layer 330 and the copper selenide precursor layer 350 have been brought into intimate contact. In FIG. 3C, a chemical reaction product layer 360 (CIGSS) has resulted from the interaction. In FIG. 3D, the reusable tool 310 and the $(Ca,Sr)F_2$ release layer 320 have been moved away from the chemical reaction product layer 360 which remains on the compliant glass substrate 340.

If the reusable tool's surface is made of silicon and the release layer of calcium fluoride, strontium fluoride, or alloys thereof (i.e., $(Ca,Sr)F_2$), then the appropriate choice of alloy composition can provide a surface for the deposition of an indium-gallium sulfo-selenide precursor with virtually the same crystallographic symmetry at their interfaces and lattice constants throughout those layers, facilitating the epitaxial growth of a highly crystalline $(In,Ga)_y(S,Se)_{1-y}$ composition layer when the precursor layers are brought into contact. Thus, the superior crystallinity of the solid phase precursor layer (pre-reaction product) resulting from the use of a crystallographically coherent tool and release layer will be retained during the formation reaction with the liquid phase precursor layer, leading to superior crystallinity in the resulting solid CIGSS absorber film, which is the reaction product.

The precursor layers shown in FIGS. 3A–3D are examples of precursor structures, and may contain other chemical elements (e.g., for the synthesis of compounds other than CIGSS as in this example). In addition to those primary compositional elements required to form the reaction product, impurities that act as surfactants in any particular material system can also be incorporated. For example in the case of CIGSS synthesis, it is preferable that at least one of these precursor layers contains an alkali impurity such as sodium to facilitate the formation and stability of smooth, planar compositional interfaces during the reaction between the fluid and solid phases created by melting of one of the precursor layers after they are brought into contact with one another. Since the function of surfactants occurs at the interface between the precursors and sublayers of different compositions, within those layers, the surfactant(s) may be initially distributed within one or both of the precursors predominately at their respective free surfaces. Alternatively, the surfactant(s) may be initially distributed between the release layer and its coupled precursor layer, especially if a group I rich template layer is located between the surfactant and the release layer. One consequence of this method of introducing a surfactant is that it will not be distributed predominately at the free surface of the final reaction product film, in contrast to all other reported methods. This can be an important advantage of the invention since sodium may be particularly undesirable near, or in, the junction region.

Each of the reactant precursor layers shown in FIGS. 3A–3D may itself be graded in composition or comprised of sublayers with different composition. In particular, the relative amounts of indium, gallium, sulfur, and selenide may vary throughout the thickness of the $(In,Ga)_y(S,Se)_{1-y}$ precursor layer but should be substantially uniform at any given depth within the layer at distinct points across the layer. Such gradients may be modified by the product reaction process but should still result in a final product film with uniform average composition across the film, albeit possibly retaining vestiges of the initial depth-dependent composition gradient.

Figure 4A:
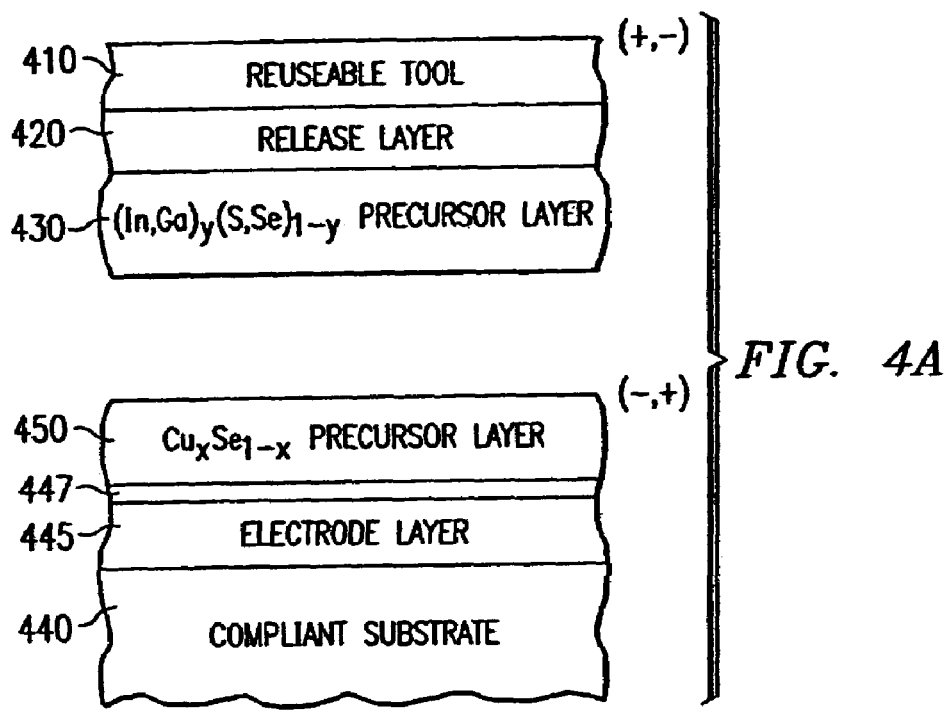
FIGS. 4A–4B illustrate schematic side views of an electrostatic field utilizing process to produce a CIGSS layer on an electrode coated substrate, representing an embodiment of the invention.
Figure 4B:
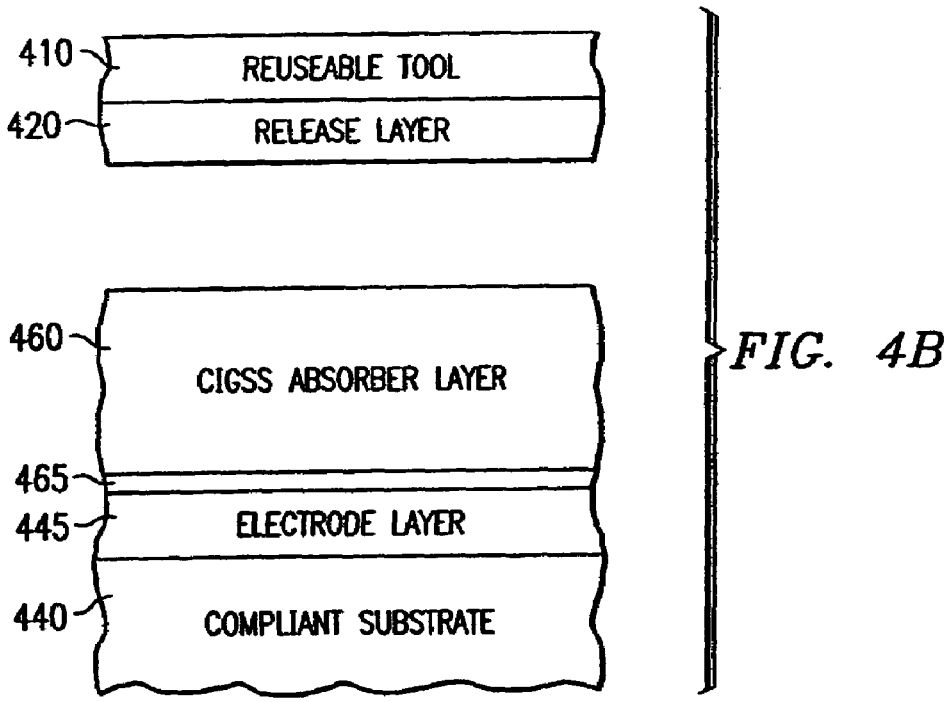

FIGS. 4A–4B show an example of applying an electrostatic field across the two precursors. Referring to the upper subassembly of FIG. 4A, a reusable tool 410 is coated with a release layer 420. The release layer 420 should have a high dielectric constant and a high breakdown voltage. A $(In,Ga)_y(S,Se)_{1-y}$ precursor layer 430 is coupled to the release layer 420. Referring to the lower subassembly of FIG. 4A, a compliant substrate 440 is coated with an electrode layer 445. A group 3 containing adhesion layer 447 is coupled to the electrode layer 445. A $Cu_xSe_{1-x}$ precursor layer 450 is coupled to the group 3 containing adhesion layer 447. The group 3 containing adhesion layer 447 can facilitate the wetting of the melted precursor. The group 3 containing adhesion layer 447 should stick to the electrode. The group 3 containing adhesion layer 447 should not melt, while the precursor layer 450 may. The parentheticals in FIG. 4A represent the voltage applied across the precursor layers during the interaction of the precursor layers. Each parenthetical includes a first value and a second value separated by a comma. The first value represents the electrostatic field configuration used to slow down the diffusion of copper. The second value represent the electrostatic field configuration used to speed up the diffusion of copper. In FIG. 4B, a CIGSS absorber layer 460 is shown coupled to a residual group 3 containing adhesion layer 465. There are no parentheticals in FIG. 4B, since the interaction is complete no electrostatic field is being applied. Needless to say, it can be advantageous to switch off the electrostatic field before attempting to move the reusable tool 410 relative to the compliant substrate 440.

Figure 5A:
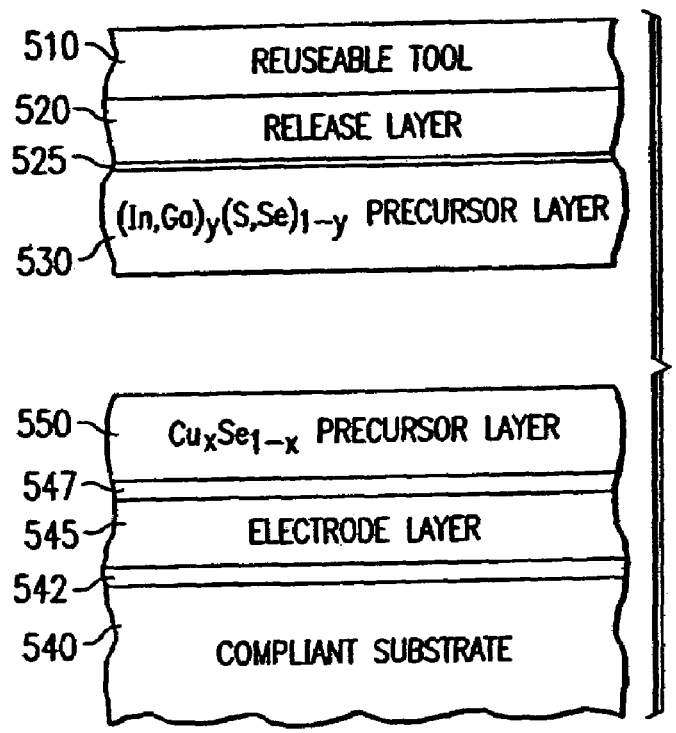
FIGS. 5A–5B illustrate schematic side views of a template utilizing process to produce a CIGSS layer on an electrode coated substrate, representing an embodiment of the invention.
Figure 5B:
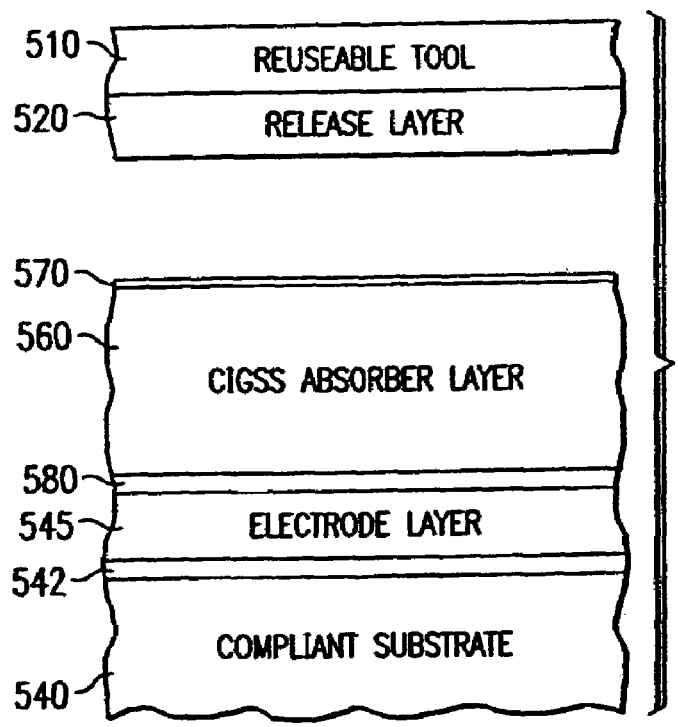

Referring now to FIGS. 5A–5B, a template can be located within the subassembly composed by the reusable tool and the $(In,Ga)_y(S,Se)_{1-y}$ layer. This can be implemented by adding some of the copper required to achieve the desired overall composition into the predominately $(In,Ga)_y(S,Se)_{1-y}$ layer or a sublayer thereof. For example, a sublayer with an overall atomic ratio of copper to indium plus gallium of about one-fifth ($0.2 \approx [Cu]/([In]+[Ga])$) to one-half may be added at the precursor's interface with the release layer, at that precursor's free surface, or throughout its entire thickness.

FIGS. 5A–5B show an example of locating multiple templates next to the precursors. Referring to the upper subassembly of FIG. 5A, a reusable tool 510 is coated with a release layer 520. As discussed above, when the release layer has a composition defining a crystalline structure that matches the crystalline structure of the desired final film (e.g., in the case of a CIGSS absorber layer $(Ca,Sr)F_2$), the release layer can function as a template. In addition to the template capability of the release layer, this example features a (Al,Cu)(In,Ga)(S,Se) template layer 525 coupled to the release layer 520. A $(In,Ga)_y(S,Se)_{1-y}$ precursor layer 530 is coupled to the (Al,Cu)(In,Ga)(S,Se) template layer 525. Referring to the lower subassembly of FIG. 5A, a compliant substrate 540 is coated with a titanium adhesion layer 542. An electrode layer 545 is coupled to the titanium adhesion layer 542. A (Al,Cu)(In,Ga)(S,Se) template layer 547 is coupled to the electrode layer 545. A $Cu_xSe_{1-x}$ precursor layer 550 is coupled to the (Al,Cu)(In,Ga)(S,Se) template layer 547. In FIG. 5B, a CIGSS absorber layer 560 is shown sandwiched between a first residual template layer 570 and a second residual template layer 580. The first residual template layer 570 corresponds to the (Al,Cu)(In,Ga)(S,Se) template layer 525. Similarly, the second residual template layer 580 corresponds to the (Al,Cu)(In,Ga)(S,Se) template layer 547. The titanium adhesion layer 542 can remain largely undisturbed between the electrode layer and the compliant substrate.

Figure 6A:
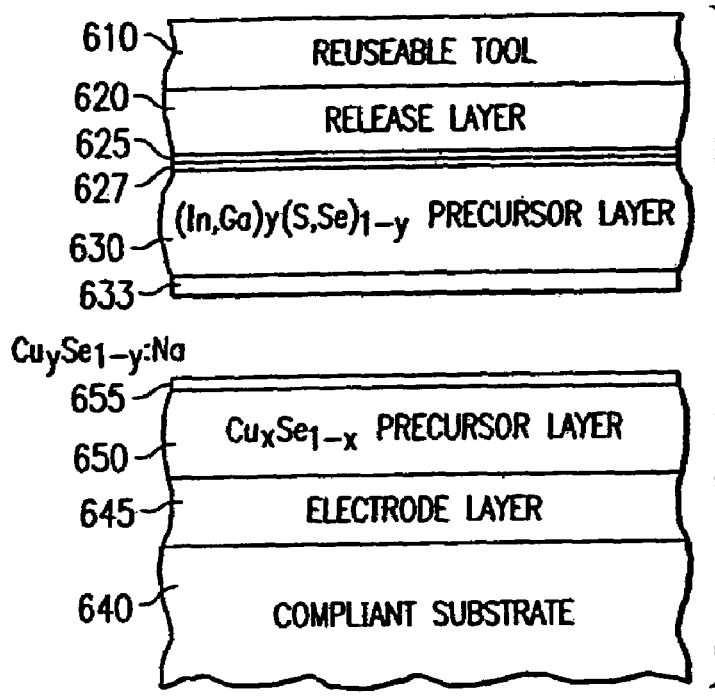
FIGS. 6A–6B illustrate schematic side views of a surfactant utilizing process to produce a CIGSS layer on an electrode coated substrate, representing an embodiment of the invention.
Figure 6B:
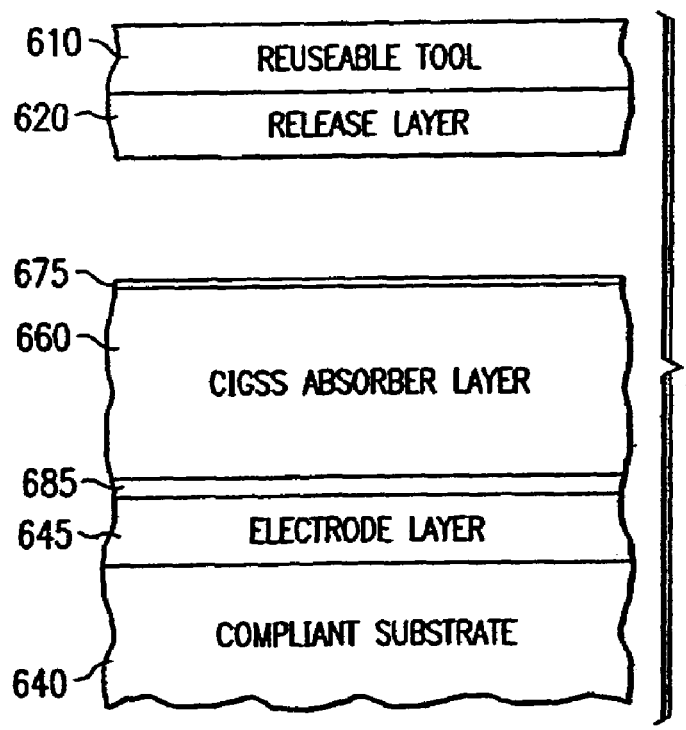

FIGS. 6A–6B show an example of locating multiple surfactant containing layers within and/or next to the precursors. Referring to the upper subassembly of FIG. 6A, a reusable tool 610 is coated with a release layer 620. An aluminum copper saturated layer 625 is coupled to the release layer 620. A sodium containing layer 627 is coupled to the aluminum copper saturated layer 625. A $(In,Ga)_y(S,Se)_{1-y}$ precursor layer 630 is coupled to the sodium containing layer 627. In addition to the surfactant capability of the sodium containing layer 627, a sodium containing layer 633 is coupled to the $(In,Ga)_y(S,Se)_{1-y}$ precursor layer 630. While this example shows both of the sodium containing layers 627 and 633, the invention does not require both, or even one, of these layers. Referring to the lower subassembly of FIG. 6A, a compliant substrate 640 is coated with an electrode layer 645. A $Cu_xSe_{1-x}$ precursor layer 650 is coupled to the electrode layer 645. In addition to the surfactant capability of the sodium containing layer 627, and the sodium containing layer 633, another sodium containing layer 655 ($Cu_xSe_{1-y}$:Na) is coupled to the $Cu_xSe_{1-x}$ precursor layer 650. While this example shows three sodium containing layers 627, 633 and 655, the invention does not require all three, or two, or even one, of these layers. Of the three depicted sodium containing layers, the sodium containing layers 627 is preferred since it may more predictably and controllably float down as diffused copper accumulates. The accumulation of diffused copper above the sodium containing layer 627 is discussed in more detail above. In FIG. 6B, a CIGSS absorber layer 660 is shown sandwiched between a residual aluminum copper saturated layer 675 and a collection layer 685. The residual aluminum copper saturated layer 675 corresponds to the aluminum copper saturated layer 625. The collection layer 685 is a zone for the collection of whatever is not incorporated in the absorber layer 660. The collection layer 685 provides process tolerance. The region of the absorber layer 660 near the electrode layer 645 is an acceptable zone for the precipitation of secondary phases that contain excess reactants. By precipitating these secondary phases, they can be irreversibly bound in a tolerable location. The collection layer can be termed a gettering layer. The collection layer 685 can be utilized with other precursor-material layer systems, not just absorbers. If not in a kinetically limited regime, at the growth interface there is an energetic barrier to further incorporation of that excess. The excess presence in the collection zone 685 can include secondary copper containing phases (e.g., $Cu_2Se$ precipitates) and/or secondary sodium containing phases (e.g., $NaInSe_2$ precipitates). The collection layer 685 can include residue from the sodium containing layer 625. The collection layer 685 can also include residue from the sodium containing layers 633 and 655 if copper from the $Cu_xSe_{1-x}$ precursor layer 650 does not overtake the sodium from the sodium containing layers 633 and 655 before the sodium from these layers reach the aluminum copper saturated layer 625. The collection layer 685 can also include other undesirable phases and debris.

The substrate preferably presents at least one compliant surface. The compliant substrate may be formed for example of a polymeric material such as polyimide, a relatively soft metal foil, or an alkali glass with a glass transition temperature near the desired processing temperature. In the latter case, the mechanical compliance that provides for intimate contact between the thin (e.g., less than or equal to approximately 10 microns) precursor layers results from softening of the glass near its glass transition temperature. The compliant substrate need not be uniform in composition, and may itself be comprised both of a nominally uniform, relatively rigid bulk with a thin compliant layer at or near its interface with the electrode layer. A non-homogenous composite substrate can be structured where the melting point is lower near the interface with the precursor. Such a layered structure can be created by chemical etching techniques that leave a porous surface structure or by the deposition of an interfacial layer of another material. The interfacial layer of another material can include melting point lowering substances such as sodium and/or potassium. The interfacial layer of another material can include a colloidal dispersion of silica sodium glass particles deposited by dipping or spraying methods. Other alkalis may be used provided that they have a lower glass transition (i.e., softening) temperature. The higher sodium or potassium containing silicates melt at a lower melting point than the lower sodium or potassium containing glasses. By coating a rigid substrate, an intimate contact between the two precursor layers can be facilitated. Without a compliant coating to facilitate intimate contact waves, ripples, ridges and other kinds of surface features may prevent the two precursor layers from coming into intimate contact with one another. Of course, the substrate does not have to be compliant.

The metal electrode preferably includes molybdenum metal, but may be a multilayered structure including other metallic layers such as titanium. In this case, the titanium can be either sandwiched between molybdenum layers as etch-stop layers or located at the back interface with the compliant substrate in order to promote adhesion of the remainder of the electrode with the compliant substrate.

The invention can include an optional adhesion layer between the copper selenide and the electrode. The adhesion layer between the copper selenide and the electrode can include a Group 3 element, (e.g., gallium) or a group 3 containing compound (e.g., indium tellurium). When the copper selenide melts into the form of liquid, it may be desirable to have a wetting layer there, and one of the best ways to create such a wetting layer is to add a Group 3 element to actually form CIGS at that back interface. As long as the dominant re-growth process occurs from the other interface, opposite the molten layer, the re-growth process may transfer the crystallographic structure from that other interface into the bulk. This depends on the relative growth rate in the two directions. The relative growth rate can be modulated by the electric fields.

The invention can include the use of barrier layers. As noted above, the release layer can simultaneously function as a barrier layer. It may be desirable to create an epitaxial silicide barrier layer between the silicon and the release layer, to prevent copper from getting into the silicon. A copper diffusion barrier useful in conjunction with the invention includes tungsten silicide. In order to get to the underlying silicon, copper needs to transport through the release layer. Therefore, one logical place to locate such a barrier can be at the interface between the silicon and the release layer. It might be useful to have another optional barrier layer near the electrode. The invention can include a barrier layer between the electrode and its adherent precursor structure, for example the copper selenide. Indium or gallium can be added into the copper selenide layer to create an interfacial layer of CIS or CIGS which would not be of high crystallographic quality, but which would adhere very strongly both to the copper selenide and the electrode. The barrier layer at that interface between the copper selenide and the electrode would help to prevent diffusion of sodium from a glass substrate into the reactant layer. However, one of the advantages of the invention is that the alkali atoms in the compliant layer may not have time to transport through the glass matrix into the electrode layer. The invention can also include an optional sodium barrier layer between the compliant substrate and the electrode. With a polyimide surface it might be necessary to use titanium as a barrier and/or adhesion layer. Titanium is an effective adhesion layer in layered systems.

While not being limited to any particular performance indicator or diagnostic identifier, preferred embodiments of the invention can be identified one at a time by testing for the presence of uniform composition at a given depth in the composition layer. The test for the presence of uniform composition at a given depth in the composition layer can be carried out without undue experimentation by the use of a simple and conventional dynamic SIMS (secondary ion mass spectroscopy) experiment. Among the other ways in which to seek embodiments having the attribute of uniform composition at a given depth in the composition layer guidance toward the next preferred embodiment can be based on the presence of uniform performance (e.g., electrical, photovoltaic, chemical, etc.).

Devices that Incorporate the Material Layers

Figure 7:
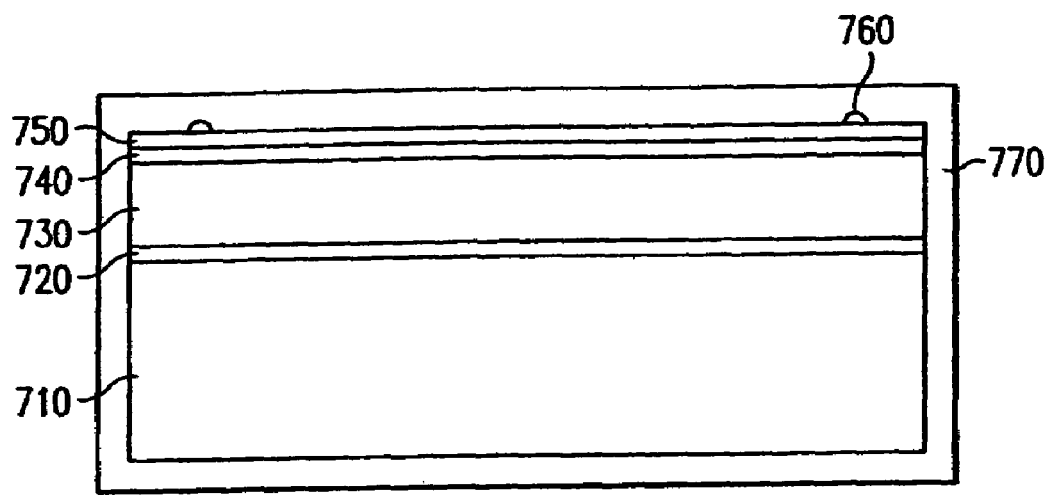
FIG. 7 illustrates a schematic sectional view of a PV device that incorporates an absorber layer formed on an electrode coated substrate, representing an embodiment of the invention.

Referring to FIG. 7, the invention can include devices that incorporate the material layer(s). FIG. 7 depicts a photovoltaic device that is useful as a solar cell for electric power generation. A glass substrate 710 is coupled to an electrode 720. The electrode 720 is coupled to an absorber layer 730. Examples of absorber layers are discussed above in detail and include CIS, CIGS, CISS, AdS, ACIGSS and CIGSS.

A buffer layer 740 is coupled to the absorber layer 730. The buffer layer 740 is sometimes inaccurately referred to as a passivating layer. A good buffer layer usable with the invention can include cadmium sulfide, for example cadmium sulfide zinc oxide. Other substantially non-conducting buffer layers include indium oxides, indium selenides, cadmium sulfide, zinc selenide, and zinc oxide and alloys thereof.

A window layer 750 is coupled to the buffer layer 740. The transparent conducting window layer 750 provides lateral conductivity. Needless to say, the window is transparent in order to get light to the absorber. And it has to be laterally conductive in order to get the electrons out and over to an external circuit via a grid line if present, or a bus bar. The window functions as a front electrode. The invention can use zinc oxide which is optically transparent as the window. Alternatively, the invention can include using a conductive zinc oxide for the window and a relatively non-conductive zinc oxide. In this case, the non-conductive zinc oxide becomes part of the buffer layer. If the window layer that provides the lateral conductivity includes zinc oxide, it can be achieved with an electrical donor impurity, examples of which are indium, gallium, aluminum or phosphorous.

An optional trace grid 760 is coupled to the window layer 750. If a grid is used, it can be a metallic bi-layer of nickel, in contact with the zinc oxide and then aluminum on top of the nickel. It is undesirable to put aluminum directly on zinc oxide since it will chemically react and form aluminum oxide which is insulating. The device includes an optional encapsulating package 770 that can be made of a polymer (e.g., poly vinyl acetate block copolymer). The device can be coupled to a bus bar (not shown).

An antireflection layer is not necessary with these materials. The buffer layer acts as an anti-reflection coating. The stack of materials described has a graded index of refraction. The refractive index drops from window to electrode. The refractive index of zinc oxide window is lower than the index of the buffer which is lower than that of the absorber. In this way, the structure builds in an anti-reflection characteristic. A problem with anti-reflection coatings is, that the in these particular type of devices, the enhancement in performance is usually not worth the extra cost.

Systems that Incorporate the Devices

Figure 8:
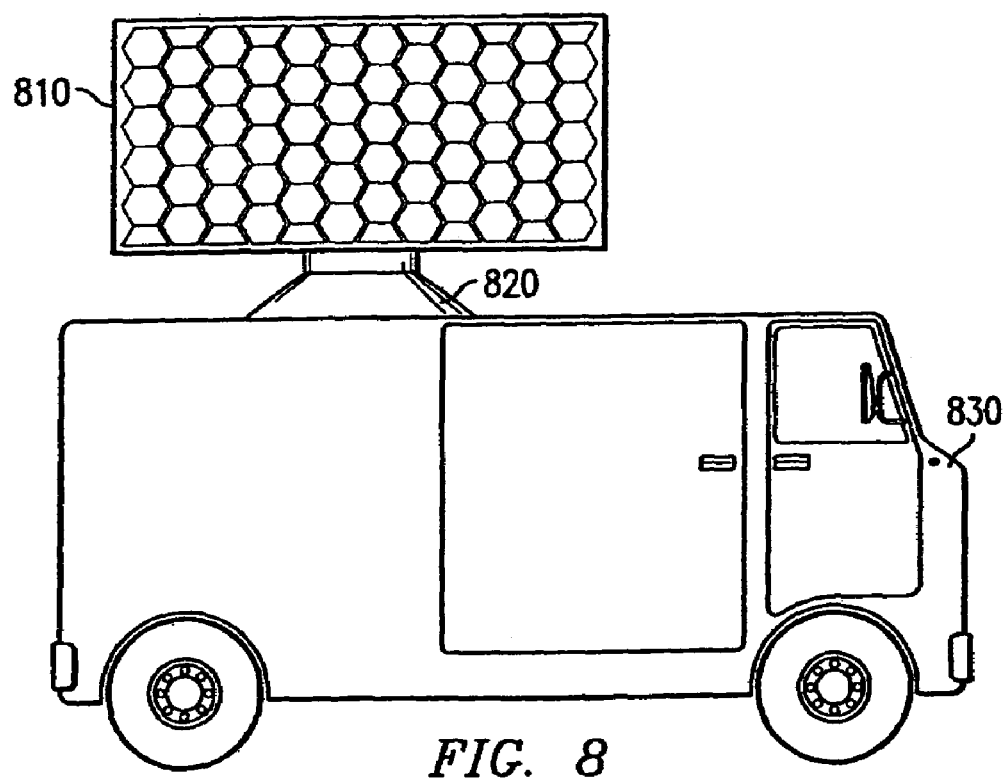
FIG. 8 illustrates a schematic elevational view of a system that incorporates a plurality of PV devices shown in FIG. 7.

Referring to FIG. 8, the invention can include systems that incorporate devices that include the material layer(s). FIG. 8 depicts a mobile electric power generating system. An array of solar cells 810 is coupled to a tracking subsystem 820. The array of solar cells 810 can be rotated and tilted by the tracking subsystem 820 and is shown in an orthogonal position for visual clarity. The tracking subsystem 820 can include electronics that include semiconductor components which include the material layer(s) described in detail above. The tracking subsystem 820 is coupled to a vehicle 830. The vehicle 830 can include an electric power storage subsystem such as a battery bank, a capacitor bank and/or an inductor bank that can include superconducting magnetic components which include the material layer(s) described in detail above.

Equipment for Manufacturing the Material Layers

Two different generic manufacturing approaches are described, of which each can implement the techniques of the invention. The first approach is designed to sequentially process substrates with a discrete tool and can therefore be termed a "batch" process. The second approach can be termed a "continuous" process uses a continuous processing tool and either a continuous series of discrete substrates or a continuously fed flexible sheet substrate.

Figure 9A:
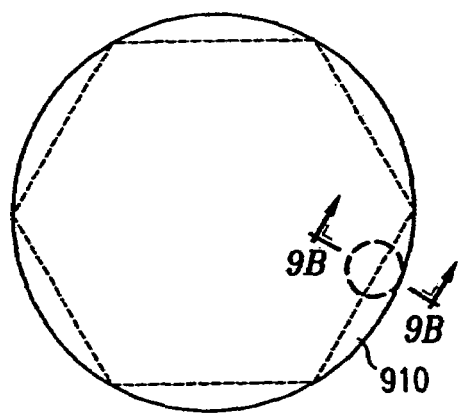
FIGS. 9A–9B illustrate top and expanded sectional views, respectively, of a release layer coated tool, representing an embodiment of the invention.
Figure 9B:
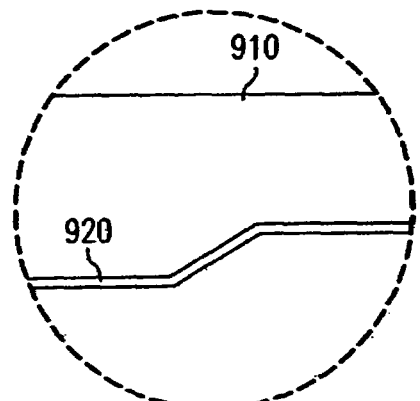

An example of a tool that can be used for discrete substrate processing is shown in FIGS. 9A–9B. FIGS. 9A–9B depict cross-sectional (FIG. 9B) and plane-view (FIG. 9A) schematic drawings of an exemplary discrete processing tool 910. A release layer 920 is coupled to the tool 910. In this example, a round silicon wafer is used as a reusable tool. This reusable tool has been patterned in cross-sectional relief to provide a raised hexagonal surface. In this example, the release layer 920 includes calcium fluoride. The raised surface of the layer 920 defines the area of contact of the tool, and its release layer, and its precursor coating (first precursor), with the substrate, and its precursor coating (second precursor). The tool's precursor coating will be brought into contact with the substrate's precursor coating and transferred during the process of formation. The use of a hexagonal pattern is only one example. Better performance for PV applications can be achieved by using geometrical patterns which can be tiled by multiple applications of the tool(s) to cover substantially all of the substrate's surface (e.g., triangles, parallelograms, etc.).

After the release layer 920 of the tool 910 has been coated with its appropriate precursor layer it is placed in contact with the substrate that has been coated with the other reactant precursor. If the tool has been already been preheated to the desired reaction temperature, pressure should be applied immediately. It may be preferable to preheat the tool and substrate to an initially lower temperature so that they may be brought into contact first and then rapidly heated while their contact pressure is increased. The pressure can be increased by increasing a mechanically applied force and/or by increasing an applied electrostatic field. The pressure can be similarly decreased.

One of the potential problems with using calcium fluoride as a release layer is that the material is mechanically soft. It may be desirable to, after transferring the product layer off of the release layer surface, recycle the release layer coated tool to a substantially higher temperature in order to get the release layer to smooth out, thereby improving the surface of the release layer for subsequent re-deposition of a fresh precursor layer. If the tool lifetime becomes problematic using a relatively soft material like calcium fluoride, it might be preferable to use an extremely hard material, for example, diamond.

Irrespective of whether the specific material combination of silicon as the reusable tool material and calcium fluoride, strontium fluoride and/or $(Ca,Sr)F_2$ as the release layer is used, it is desirable that the materials used for these components be capable of sustaining the high processing temperatures of at least approximately 500° C., preferably at least approximately 600° C., without excessive degradation of their mechanical, crystallographic, and electrical properties.

One of the advantages of the invention is that most of the heat required to form a high-quality final layer can be provided by heat flow through the tool and release layer rather than by heating the compliant substrate. This permits the use of materials for the substrate that would not be stable if heated to such high temperatures for extended periods of time (e.g., plastics such as polyimide). Thus, the total thermal budget for the process can be reduced by either very rapid heating (e.g., greater than or equal to approximately 50° C./second) of the tool after it is brought into contact with the substrate, or by very brief contact (e.g., less than or equal to approximately 2 seconds, preferably less than or equal to approximately 0.5 seconds) between the preheated tool and substrate (i.e., long enough for the material layer composition formation to be substantially complete).

Rapid heating may be achieved by numerous methods including but not limited to the following approaches. Rapid heating may be achieved by applying an electrical bias to the silicon wafer while simultaneously passing a current pulse through the wafer laterally to rapidly heat it (this approach may require a holder for the tool designed to make at least two electrical contacts on opposite edges of the wafer). Rapid heating may be achieved by bringing an electrically biased, heated piston into contact with the back side of the tool. Rapid heating may be achieved by heating the rear surface of the wafer radiatively to the reaction temperature while separately biasing the wafer via an electrical contact to the wafer. Of course, these rapid heating methods can be combined.

Figure 10:
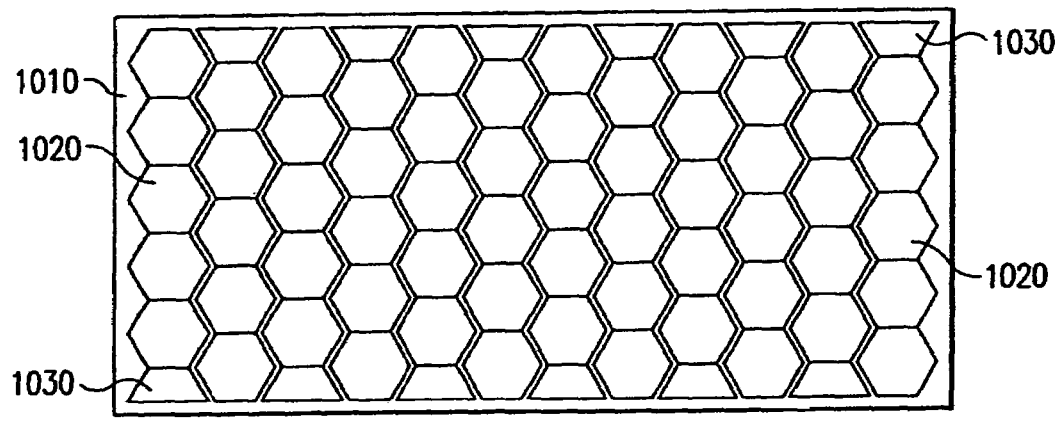
FIG. 10 illustrates a schematic view of an hexagonal array of release layer coated tools, representing an embodiment of the invention.

Referring to FIG. 10, an apparatus for implementing this process need not necessarily handle each tool as a separate entity. Tools may, for example, be placed together into an array on a larger platen, which is then treated as a meta-tool in the same manner as described above. For this variation of the apparatus design it may be preferable to shape a plurality of individual tools as hexagon shaped wafers, rather than providing a hexagonal relief on a round silicon wafer, to define the contact area between the meta-tool and substrate. Multiple step-and-repeat transfer steps might be required to create a close-packed tiled array of reactant product film areas over a large substrate, particularly if the ganged-wafer tool is itself not a close-packed tiled array.

FIG. 10 depicts a tool-mounting platen 1010 used to gang together individual hexagonal wafers 1020 (and half-wafers 1030). The platen 1010 can provide parallel electrical contacts to these wafers for simultaneous processing. The tool shown in FIG. 10 would enable simultaneous formation of a material layer (e.g., chemical product film) over substantially a substrate's entire surface, even if the substrate were large. Substrates larger than the depicted meta-tool could also be accommodated with a step and repeat approach. The individual wafers need not necessarily be hexagonal, but could also be, for example, triangular or rectangular. The tool wafers need not necessarily be composed of a single crystal, but could instead be multicrystalline.

Figure 11:
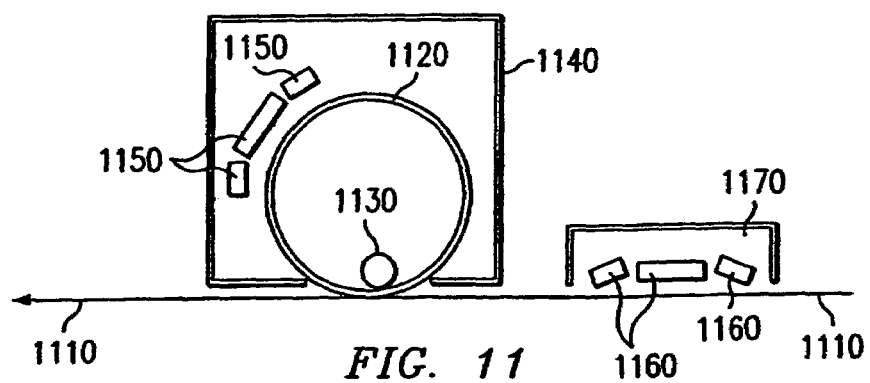
FIG. 11 illustrates a schematic cross view of a manufacturing system that includes a release layer coated rotating cylindrical tool, representing an embodiment of the invention.

The invention can include continuous substrate processing apparatus. An alternative to the use of multiple individual wafers in a planar array is shown in FIG. 11. FIG. 11 depicts a schematic drawing of an exemplary continuous processing apparatus to implement the reactive synthesis and simultaneous transfer method of multinary compound formation.

A continuous substrate 1110 (web) passes under a rotating cylindrical tool 1120. A radiant heater 1130 is located within the tool 1120. The tool 1120 and the radiant heater 1130 are located within a housing 1140. A series of deposition sources 1150 for the precursor that is carried by the tool is also located within the housing 1140. Upstream from the tool 1120 is a series of deposition sources 1160 for the precursor that is carried by the substrate 1110. The sources 1160 are located within a housing 1170. The tangental approach of the cylindrical tool 1120 may cause the pressure exerted on the precursors to ramp-up and then ramp-down. This can be a significant advantage in transport reactions.

FIG. 11 shows a cylindrical tool geometry. For CIS synthesis this type of tool could be made of either a single continuous silicon tube[16] or multiple rectangular silicon slabs mounted onto a supporting tube, with each rectangular slab then ground to create a cylindrical surface when the slabs abut one another. This type of tool is most useful for processing either a continuously fed flexible sheet or a continuous series of discrete substrates.

In the case of the silicon tool and calcium fluoride release layer structure, an alloy can be used to bond semicylindrical or arcuate tools to a metal drum. This would permit piecewise replacement of the silicon tools, rather than having to replace all the tools on the whole drum which might be required if the drum is made of solid silicon. There are good mechanical reasons to use a bonding alloy as well, such as thermal expansion considerations. Further, it may be more cost-effective to make the drum out of strips of silicon rather than a whole cylinder of silicon.

It is desirable that the release layer stay on the tool when the composition layer is transferred off the release layer. As noted above, the invention can include an optional adhesion layer between the tool and the release layer. The release layer can be part of the tool and preferably remains part of the tool after separation. Whether such an optional adhesion layer is needed depends on the material used for the release layer and for the body of the tool. If the body of the tool, for example is silicon, and the release layer, for example is calcium fluoride, there may be no need to introduce an adhesion layer in between the two. The adhesion between those surfaces is by an epitaxial transition that creates a chemical bond between the calcium fluoride and the silicon, which sticks very well. However, other material combinations might benefit from such an optional adhesion layer.

The particular manufacturing process used for implementing the invention should be inexpensive and reproducible. Conveniently, the pressurization aspect of the invention can be carried out by using any force application method. It is preferred that the process be controllable over a wide range of pressures, most preferably within a short time domain. For the manufacturing operation, it is an advantage to employ a direct mechanical technique.

However, the particular manufacturing process used for applying pressurization is not essential to the invention as long as it provides the described functionality. Normally those who make or use the invention will select the manufacturing process based upon tooling and energy requirements, the expected application requirements of the final product, and the demands of the overall manufacturing process.

The particular apparatus used for the pressure applying apparatus should be strong, serviceable and retoolable. Conveniently, the pressure applying apparatus of the invention can be made of any heat resistant material. It is preferred that the material be tough, corrosion resistant and amenable to cleaning.

However, the particular apparatus selected for applying pressure to the substrate(s) and/or tool(s) is not essential to the invention, as long as it provides the described function. Normally, those who make or use the invention will select the best commercially available material based upon the economics of cost and availability, the expected application requirements of the final product, and the demands of the overall manufacturing process.

The disclosed embodiments show platens or a roller and conveyor as the structure for performing the function of applying pressure, but the structure for applying pressure can be any other structure capable of performing the function of applying pressure, including, by way of example a hydraulic system, an expanding gas or even an isostatic working fluid.

The electrostatic field aspect of the invention can be carried out by using any voltage application technique. It is preferred that the voltage application technique be controllable over a wide range of voltages, most preferably within a short time domain. However, the particular technique used to apply the voltage is not essential to the invention as long as it generates the described electrostatic field. The apparatus used to apply the voltage can be made of any electrically conductive material. It is preferred that the electrically conductive material be heat resistant, corrosion resistant and amenable to cleaning. However, the particular apparatus used to apply the voltage is not essential to the invention as long as it is capable of generating the required field.

The particular deposition process used for providing the templates should be inexpensive and reproducible. It is preferred that the process for applying the template be sputtering followed by plasma discharge, particle deposition, physical vapor deposition and/or chemical vapor deposition. However, the particular process used to deposit the templates is not essential to the invention so long as it provides a template possessing the described functionalities.

The particular process used to provide the surfactant as an impurity should also be inexpensive and reproducible. It is preferred that the surfactant impurity be provided by sputtering followed by plasma discharge, particle deposition, physical vapor deposition and/or chemical vapor deposition. However, the particular process used for providing the surfactant is not essential to the invention as long as it provides a surfactant containing layer having the described functionalities.

The invention can also utilize data processing methods that transform signals from the precursor and/or product layers to control process variables. For example, the invention can be combined with instrumentation to obtain state variable information to actuate interconnected discrete hardware elements. For instance, the invention can include the use of pressure, voltage, current and/or temperature sensors to control pressure exerting and/or heating equipment. Thus, the pressure exerted and/or the heat applied can be varied (e.g., in time domain) as a function of a state variable. Similarly, vacuum and/or cooling equipment may be provided and controlled.

The term layer, as used herein, is generically defined to include films, coatings and thicker structures. The term coating, as used herein, is subgenerically defined to include thin films, thick films and thicker structures. The term composition, as used herein, is generically defined to include inorganic and organic substances such as, but not limited to, chemical reaction products and/or physical reaction products. The term selenide, as used herein is defined as a material that includes the element selenium and does not include enough oxygen to precipitate a separate selenate base; oxygen may be present in selenide. The term tool, as used herein, is defined as a substrate intended for re-use or multiple use. The terms a or an, as used herein, are defined as one or more than one. The term another, as used herein, is defined as at least a second or more. The term plurality, as used herein, is defined as two or more than two. The terms including and/or having, as used herein, are defined as comprising (i.e., open language). The term coupled, as used herein, is defined as connected, although not necessarily directly, and not necessarily mechanically. The term approximately, as used herein, is defined as at least close to a given value (e.g., preferably within 10% of, more preferably within 1% of, and most preferably within 0.1% of). The term substantially, as used herein, is defined as at least approaching a given state (e.g., preferably within 10% of, more preferably within 1% of, and most preferably within 0.1% of). The term deploying, as used herein, is defined as designing, building, shipping, installing and/or operating. The term means, as used herein, is defined as hardware, firmware and/or software for achieving a result. The term program or phrase computer program, as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

Practical Applications of the Invention

A practical application of the invention that has value within the technological arts is the manufacture of photovoltaic devices such as absorber films or electroluminescent phosphors. Further, the invention is useful in conjunction with the fabrication of semiconductors (such as are used for the purpose of transistors), or in conjunction with the fabrication of superconductors (such as are used for the purpose magnets or detectors), or the like. There are virtually innumerable uses for the invention, all of which need not be detailed here.

Advantages of the Invention

Coating or film synthesis representing an embodiment of the invention, can be cost effective and advantageous for at least the following reasons. The invention improves the control of defect properties. The invention improves quality and reduces costs compared to previous approaches.

All the disclosed embodiments of the invention disclosed herein can be made and used without undue experimentation in light of the disclosure. The invention is not limited by theoretical statements recited herein. Although the best mode of carrying out the invention contemplated by the inventor is disclosed, practice of the invention is not limited thereto. Accordingly, it will be appreciated by those skilled in the art that the invention may be practiced otherwise than as specifically described herein.

The individual components need not be formed in the disclosed shapes, or combined in the disclosed configurations, but could be provided in virtually any shapes, and/or combined in virtually any configuration. Further, the individual components need not be fabricated from the disclosed materials, but could be fabricated from virtually any suitable materials. Further, homologous replacements may be substituted for the substances described herein. Further, variation may be made in the steps or in the sequence of steps composing methods described herein.

Further, although the compositional layer described herein can be a separate module, it will be manifest that the compositional layer may be integrated into the device and/or system with which it is associated (e.g., a photovoltaic devices including the compositional layer as an absorber between an electrode and a buffer layer). Furthermore, all the disclosed elements and features of each disclosed embodiment can be combined with, or substituted for, the disclosed elements and features of every other disclosed embodiment except where such elements or features are mutually exclusive.

It will be manifest that various substitutions, modifications, additions and/or rearrangements of the features of the invention may be made without deviating from the spirit and/or scope of the underlying inventive concept. It is deemed that the spirit and/or scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" and/or "step for." Subgeneric embodiments of the invention are delineated by the appended independent claims and their equivalents. Specific embodiments of the invention are differentiated by the appended dependent claims and their equivalents.

REFERENCES

1. L. L. Kazmerski, F. R. White, and G. K. Morgan, Appl. Phys. Lett. 29, 268 (1976).
2. R. A. Mickelsen, U.S. Pat. No. 4,392,451 (1983).
3. R. A. Mickelsen and W. S. Chen, U.S. Pat. No. Re31,968 (1985).
4. R. A. Mickelsen, U.S. Pat. No. 4,523,051 (1985).
5. H. W. Schock, Appl. Surf Sci. 92, 606 (1995).
6. M. A. Contreras, B. Egaas, K. Ramanathan, J. Hiltner, A. Swartzlander, F. Hasoon, and R. Noufi, Progr. PV 7, 311 (1999).
7. R. R. Arya, T. C. Lommasson, S. Wiedeman, L. Russell, S. Skibo, and J. Fogleboch, in The Conference Record of the 23rd IEEE Photovoltaic Specialists Conference (Institute of Electrical and Electronic Engineers, Louisville, Ky., 1993), 516.
8. G. E. Hassan, M. R. I. Ramadan, H. El-Labani, M. H. Badawi, S. Aboul-Enein, M. J. Carter, and R. Hill, Semicond. Sci. Technol. 9, 1255 (1994).
9. V. Probst, F. Karg, J. Rimmasch, W. Riedl, W. Stetter, H. Harms, and Eibl, in Materials Research Society Symposium Proceedings 426, San Francisco, Calif., 1996 (Materials Research Society), p. 165.
10. V. Kapur, B. Basol, and E. S. Tseng, Solar Cells 21, 65 (1987).
11. B. M. Basol and V. K. Kapur, in The Conference Record of the 22nd IEEE Photovoltaic Specialists Conference (Institute of Electrical and Electronic Engineers, Las Vegas, Nev., 1991), 893.
12. C. Guillen and J. Herrero, J. Electroch. Soc. 142, 1834 (1995).
13. C. Eberspacher, K. Pauls, and J. Serra, in Conference Record of the 28th IEEE Photovoltaic Specialists Conference (Institute of Electrical and Electronic Engineers, Anchorage, 2000), 517.
14. C.-H. Chang, B. J. Stanbery, A. A. Morrone, A. Davydov, and T. J. Anderson, in MRS symposium proceedings 485, Boston, Mass., 1997 (Materials Research Society), p. 163.
15. P. Teheran, G. Cediel, L. M. Caicedo, L. Cota, H. Leal, H. A. Rodrigue, and G. Gordillo, J. Crystal Growth 183, 352 (1998).
16. B. H. Mackintosh, M. P. Ouellette, M. D. Rosenblum, J. P. Kalejs, and B. P. Piwczyk, in *Conference Record of the 28th IEEE Photovoltaic Specialists Conference* (Institute of Electrical and Electronic Engineers, Anchorage, 2000), 46.
17. The Electrical Engineering Handbook, CRC Press, (Richard C. Dorf et al. eds.), 1993.

What is claimed is:

1. An apparatus, comprising:
a first holder;
a second holder coupled to the first holder;
a linkage coupled to the first holder and the second holder to move the first holder relative to the second holder;
a reusable tool coupled to the first holder, the reusable tool including a raised patterned surface; and
a release layer coupled to the raised patterned surface of the reusable tool, wherein the first holder is adapted to hold a plurality of reusable tools.

2. The apparatus of claim 1, wherein the second holder is selected from the group consisting of a platten, a roller and a conveyor.

3. The apparatus of claim 1, wherein the linkage includes a pressure generator adapted to generate a pressure between the release layer and the second holder.

4. The apparatus of claim 3, wherein the pressure generator can exert a pressure of from approximately 0.01 atm to approximately 10.0 atm between the release layer and the second holder.

5. The apparatus of claim 1 further comprising a heater coupled to the first holder.

6. The apparatus of claim 5, wherein the first holder includes a roller and the heater is located within the roller.

7. An apparatus, comprising:
a first holder;
a second holder coupled to the first holder;
a linkage coupled to the first holder and the second holder to move the first holder relative to the second holder;
a reusable tool coupled to the first holder, the reusable tool including a raised patterned surface;
a release layer coupled to the raised patterned surface of the reusable tool;
a heater coupled to the first holder; and
a cooler coupled to the first holder, where the heater applies an electrical bias to the reusable tool while simultaneously passing a current pulse through the reusable tool laterally.

8. The apparatus of claim 7, wherein the heater can establish a temperature within a precursor layer that can be coupled to the second holder, between the release layer and the second holder, of from approximately 520° C. to approximately 635° C.

9. An apparatus, comprising:
a first holder;
a second holder coupled to the first holder;
a linkage coupled to the first holder and the second holder to move the first holder relative to the second holder;
a reusable tool coupled to the first holder, the reusable tool including a raised patterned surface;
a release layer coupled to the raised patterned surface of the reusable tool;
a heater coupled to the first holder; and
a cooler coupled to the first holder, wherein the heater includes an electrically biased, heated piston that can be brought into contact with the first holder.

10. An apparatus, comprising:
a first holder;
a second holder coupled to the first holder;
a linkage coupled to the first holder and the second holder to move the first holder relative to the second holder;
a reusable tool coupled to the first holder, the reusable tool including a raised patterned surface;
a release layer coupled to the raised patterned surface of the reusable tool;
a heater coupled to the first holder; and
a cooler coupled to the first holder, wherein the heater radiatively heats the first holder to a reaction temperature while simultaneously biasing the reusable tool via an electrical contact that is coupled to the reusable tool.

11. An apparatus, comprising:
a first holder;
a second holder coupled to the first holder;
a linkage coupled to the first holder and the second holder to move the first holder relative to the second holder;
a reusable tool coupled to the first holder, the reusable tool including a raised patterned surface;
a release layer coupled to the raised patterned surface of the reusable tool; and a precursor deposition subassembly coupled to the second holder, the precursor deposition subassembly adapted to couple a precursor layer to the second holder, wherein the release layer includes at least one fluoride selected from the group consisting of $CaF_2$ and $SrF_2$.

12. An apparatus, comprising:
a first holder;
a second holder coupled to the first holder;
a linkage coupled to the first holder and the second holder to move the first holder relative to the second holder;
a reusable tool coupled to the first holder, the reusable tool including a raised patterned surface;
a release layer coupled to the raised patterned surface of the reusable tool;
a precursor deposition subassembly coupled to the second holder, the precursor deposition subassembly adapted to couple a precursor layer to the second holder; and
a circuit coupled to the first holder and the second holder to apply an electrostatic field across the first holder and the second holder.

13. The apparatus of claim 12, wherein the circuit can apply an electrostatic field strength of from approximately 0.03 volts/micron to approximately 3.5 volts/micron.

14. The apparatus of claim 13, wherein the electrostatic field strength can be from approximately 0.3 volts/micron to approximately 1.0 volts/micron.

* * * * *